(12) United States Patent
Sharma et al.

(10) Patent No.: US 8,586,208 B2
(45) Date of Patent: Nov. 19, 2013

(54) STABLE ELECTRODES WITH MODIFIED WORK FUNCTIONS AND METHODS FOR ORGANIC ELECTRONIC DEVICES

(75) Inventors: Asha Sharma, Salt Lake City, UT (US); Peter Hotchkiss, Albuquerque, NM (US); Benoit Domercq, Waterloo (BE); Seth Marder, Atlanta, GA (US); Bernard Kippelen, Decatur, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 13/003,923

(22) PCT Filed: Jul. 15, 2009

(86) PCT No.: PCT/EP2009/059027
§ 371 (c)(1),
(2), (4) Date: Jan. 13, 2011

(87) PCT Pub. No.: WO2010/007081
PCT Pub. Date: Jan. 21, 2010

(65) Prior Publication Data
US 2011/0114935 A1 May 19, 2011

Related U.S. Application Data

(60) Provisional application No. 61/081,808, filed on Jul. 18, 2008.

(51) Int. Cl.
*H01L 51/54* (2006.01)
(52) U.S. Cl.
USPC ........... 428/690; 428/917; 313/504; 313/505; 313/506; 257/40; 257/E51.05; 257/E51.026; 257/E51.032; 562/20; 562/24

(58) Field of Classification Search
USPC .............. 428/690, 917; 313/504, 505, 506; 257/40, E51.05, E51.026, E51.032; 562/20, 24
See application file for complete search history.

(56) References Cited

U.S. PATENT DOCUMENTS

| | | | | |
|---|---|---|---|---|
| 5,272,035 A | * | 12/1993 | Sekiya | ......................... 430/157 |
| 6,406,804 B1 | * | 6/2002 | Higashi et al. | ............... 428/690 |
| 2005/0239054 A1 | | 10/2005 | Arimilli et al. | |
| 2008/0003449 A1 | | 1/2008 | Hsu et al. | |

FOREIGN PATENT DOCUMENTS

| | | |
|---|---|---|
| DE | 102004057760 A1 | 6/2006 |
| EP | 524023 A1 | 1/1993 |
| JP | 1121255 A | 5/1989 |

(Continued)

OTHER PUBLICATIONS

Schwartz et al., Advanced Surface Modification of Indium Tin Oxide for Improved Charge Injection in Organic Devices, 2005, J. Am. Chem. Soc., vol. 127, pp. 10058-10062.*

(Continued)

*Primary Examiner* — Gregory Clark
(74) *Attorney, Agent, or Firm* — Foley & Lardner LLP

(57) ABSTRACT

A device including an electrode, the electrode having a surface; a molecule bound to the surface of the electrode through a binding group; an organic electronic material in electrical contact with the electrode, wherein the molecule comprises at least one fluorinated aryl group, wherein the electrode contains a transparent conductive metal oxide, a carbon nanotube, or graphene.

6 Claims, 20 Drawing Sheets

(56) References Cited

FOREIGN PATENT DOCUMENTS

| WO | WO 2006124670 A2 | 11/2006 |
|----|------------------|---------|
| WO | WO 2010007081 A1 | 1/2010  |
| WO | WO 2010100194 A1 | 9/2010  |
| WO | WO 2010115854 A1 | 10/2010 |

OTHER PUBLICATIONS

Zaban et al., Molecular Adjustment of the Electronic Properties of Nanoporous Electrodes in Dye-Sensitized Solar Cells, 2005, J. Phys. Chem. B, vol. 109, pp. 189007-18913.*

Roe et al., The Synthesis of Dimethykaminoethyl Esters of Aromatic Phosphonic Acids, 1952, J. Org. Chem. Soc., vol. 18, pp. 362-366.*

S. H. Jee. et al.—, "Study on Work Function of ITO Modified by Using a Self-Assembly Monolayer for Oragnic based Devices", J. Kor. Phys. Soc. 49(5), Nov. 2006, pp. 2034-2039.

Koh, Sharon E., et al—"Phenylphosphonic Acid Functionalization of Indium Tin Oxide: Surface Chemistry and Work Functions" Langmuir, 2006, 22 (14), pp. 6249-6255; 7 pgs.

Bhattacharya, Alok K., et al—"Michaelis-Arbuzov Rearrangement", Chem. Rev., 1981, vol. 81 (4), pp. 415-430; 16 pgs.

Gooβen, Lukas J., et al—"Practical Protocol for the Palladium-Catalyzed Synthesis of Arylphosphonates from Bromoarenes and Diethyl Phosphite", Synlett 2005(3): 445-448; 4 pgs.

Han, Li-Biao, et al—"High Reactivity of a Five-Membered Cyclic Hydrogen Phosphonate Leading to Development of Facile Palladium-Catalyzed Hydrophosphorylation of Alkenes", J. Am. Chem. Soc., 2000, vol. 122 (#22), pp. 5407-5408; 2 pgs.

Henderson, William, et al—"Platinum(II) complexes containing ferrocene-derived phosphonate ligands; synthesis, structural characterisation and antitumour activity", Inorganica Chimica Acta vol. 322, Issues 1-2, Oct. 8, 2001, pp. 106-112; 7 pgs.

Alloway, Dana M., et al—"Interface Dipoles Arising from Self-Assembled Monolayers on Gold: UV-Photoemission Studies of Alkanethiols and Partially Fluorinated Alkanethiols", J. Phys. Chem. B 2003, 107, 11690-11699; 10 pgs.

Rice, Bobbie L., et al—"Perfluorocarbon Phosphonic and Sulfonic Acids Containing Discretely Varying Terminal Functional Groups", Inorg. Chem., 1991, 30 (24), pp. 4635-4638; 4 pgs.

Montoneri, E., et al—"Organosulphur Phosphorus Acid Compounds. IV: Fluorobenzylphosphono-Sulphonic Acids", Phosphorus, Sulfur and Silicon, 1994, vol. 86, pp. 145-155; 11 pgs.

Chempacific Product List #60139, CAS # 1869-27-8 —"(4-Trifluoromethyl-Phenyl) Phosphonic Acid", Chemical Book, 2010, 1 pg.

Pfammatter, Michael J., et al—"Synthesis of ω-Substituted Alkanethiols and (Bromomethyl)methylthiomalonates", Helvetica Chimica Acta, vol. 84, Issue 3, pp. 678-689, Mar. 21, 2001; 12 pgs.

Sharma, Asha, et al—"Effect of phosphonic acid surface modifiers on the work function of indium tin oxide and on the charge injection barrier into organic single-layer diodes", Journal of Applied Physics, Apr. 2009, vol. 105, Issue:7, pp. 074511-074516; 6 pgs.

Paniagua, Sergio, et al—"Phosphonic Acid Modification of Indium-Tin Oxide Electrodes: Combined XPS/UPS/Contact Angle Studies", J. Phys. Chem. C, 2008, 112 (21), pp. 7809-7817; 9 pgs.

Khodabakhsh, Saghar, et al—"Using Self-Assembling Dipole Molecules to Improve Hole Injection in Conjugated Polymers", Advanced Functional Materials, vol. 14, Issue 12, pp. 1205-1210, Dec. 2004; 6 pgs.

Sharma, Asha, et al—"Tailoring the work function of indium tin oxide electrodes in electrophosphorescent organic light-emitting diodes", 2009, J. Appl. Phys. 105, 084507; 6 pgs.

Wobkenberg, Paul H., et al—"Low-voltage organic transistors based on solution processed semiconductors and self-assembled monolayer gate dielectrics", 2008, Appl. Phys. Lett. 93, 013303;3 pgs.

Krecmerova, Marcella, et al—"Preparation of Phosphonomethyl Ethers Derived from 2-Phenylethanol and Its Amino Derivatives", Collect. Czech. Chem. Commun. 1995, 60, 659-669; 11 pgs.

U.S. Appl. No. 61/166,877, filed Apr. 6, 2009, Asha Sharma, et al.

Klauk, Hagen. *Organic Electronics: Materials, Manufacturing and Applications*. Weinheim, Germany: Wiley-VCH Verlag GmbH & Co., KGaA, 2006.

Nalwa, Hari Singh. *Handbook of Organic Electronics and Photonics: Electronic Materials and Devices*. vol. 1, Stevenson Ranch, California: American Scientific Publishers, 2008.

Nalwa, Hari Singh. *Handbook of Organic Electronics and Photonics: Photonic Materials and Devices*. vol. 2, Stevenson Ranch, California: American Scientific Publishers, 2008.

Nalwa, Hari Singh. *Handbook of Organic Electronics and Photonics: Electronic and Photonic Devices*. vol. 3, Stevenson Ranch, California: American Scientific Publishers, 2008.

Mullen, Klaus, et al. *Organic Light Emitting Devices: Synthesis, Properties and Applications*. Weinheim, Germany: Wiley-VCH Verlag GmbH & Co., KGaA, 2006.

Sun, Sam-Shajing, et al. *Organic Photovoltaics: Mechanisms, Materials and Devices*. Boca Raton, Florida: CRC Press, Taylor & Francis Group, 2005.

Bao, Zhenan, et al. *Organic Field-Effect Transistors*. Boca Raton, Florida: CRC Press, Taylor & Francis Group, 2007.

* cited by examiner

FIG 4
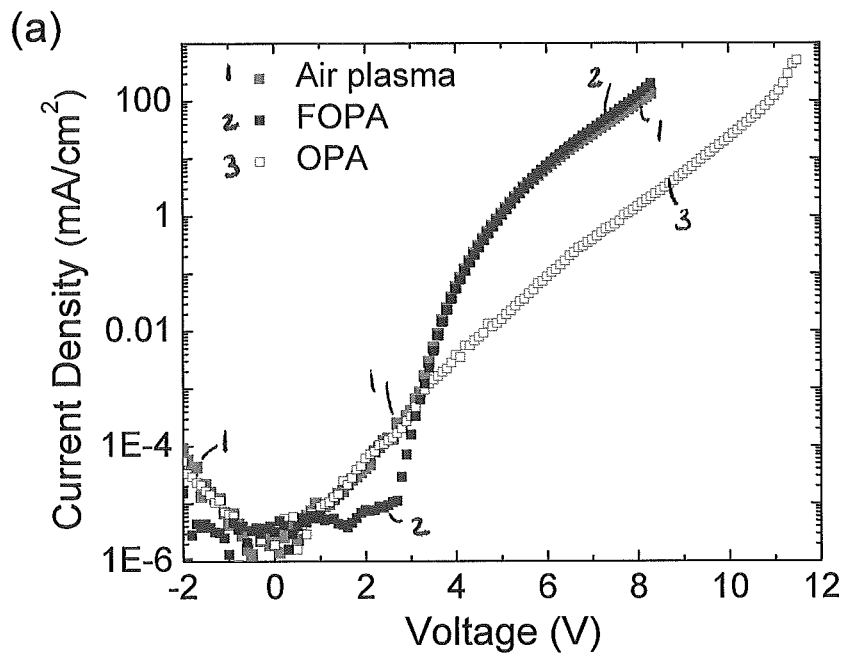
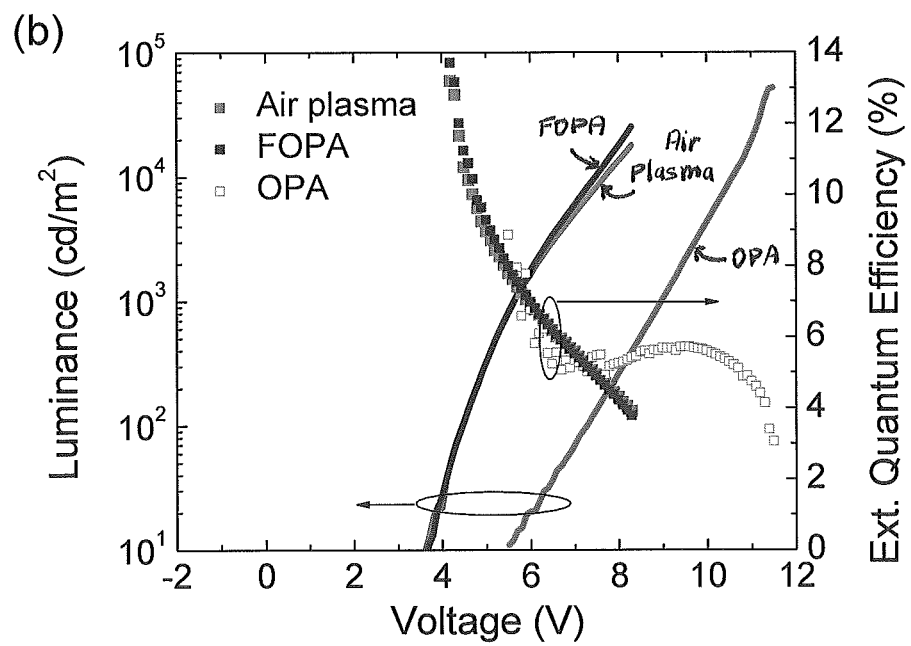

$t_{1/2}$ (Air plasma) = 97 Hrs
$t_{1/2}$ (FOPA, 7.9 mA/cm$^2$) > 150 Hrs
$t_{1/2}$ (FOPA, 6 mA/cm$^2$) > 325 Hrs FIG 6
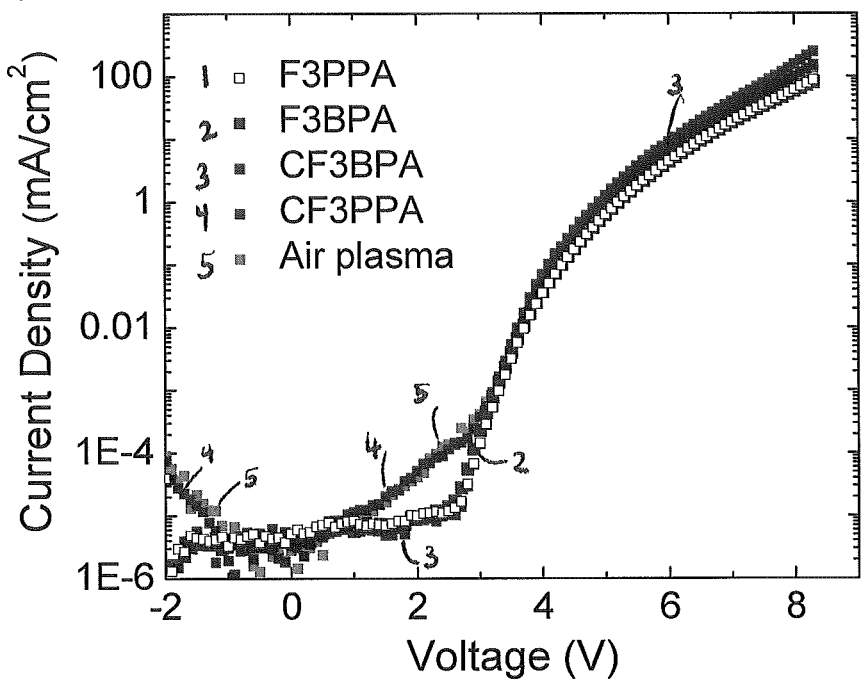
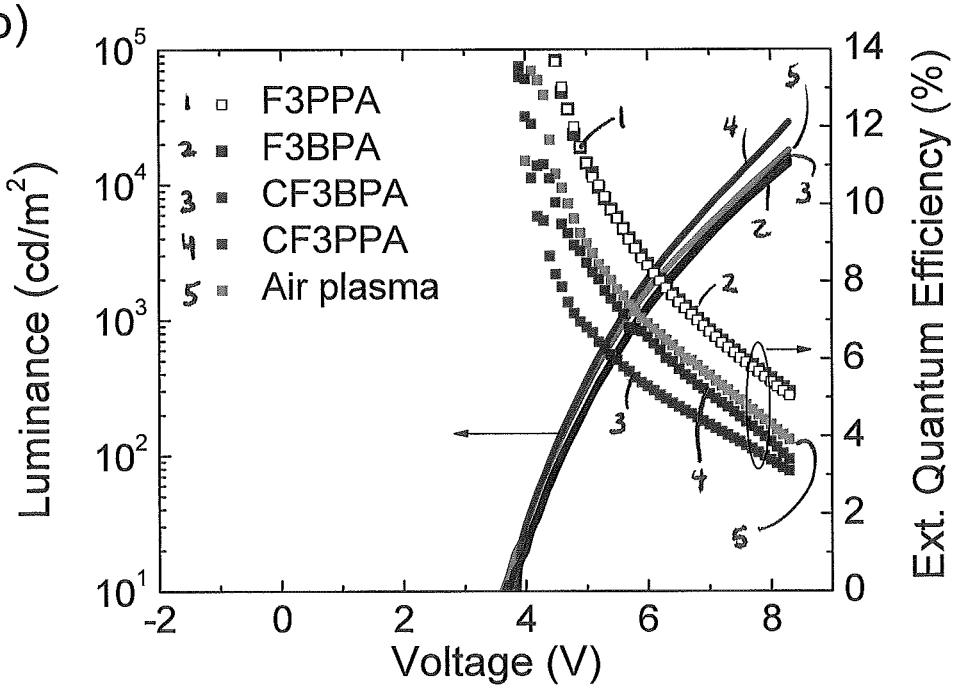

FIG 7
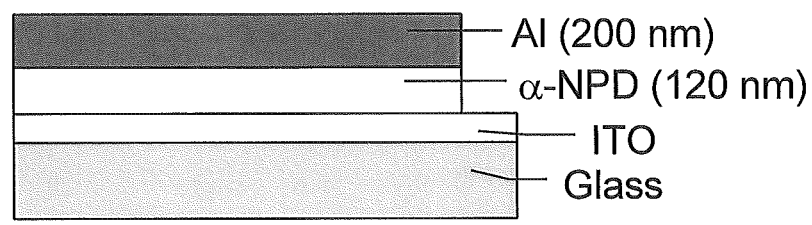
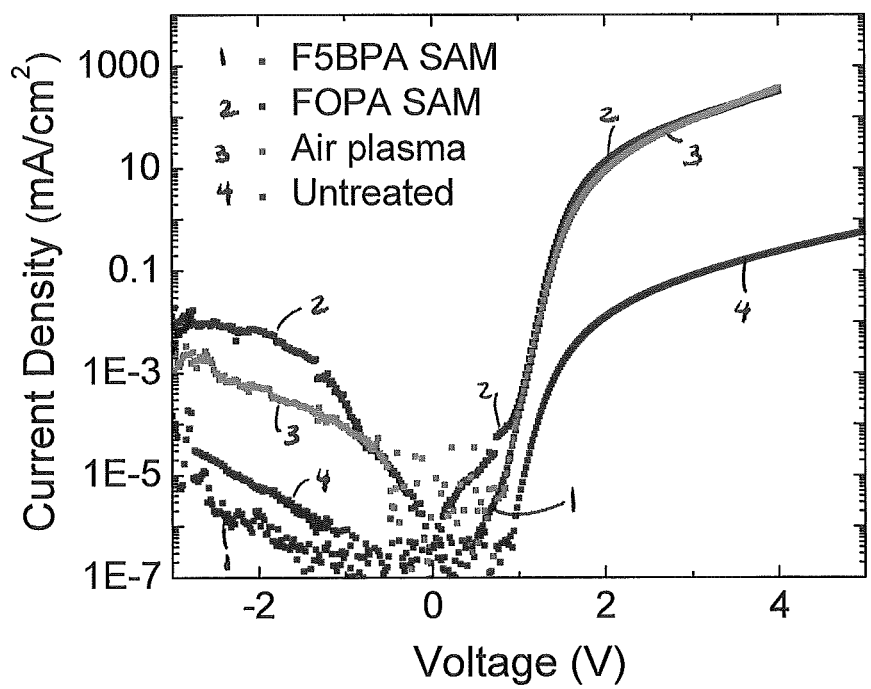

FIG 10
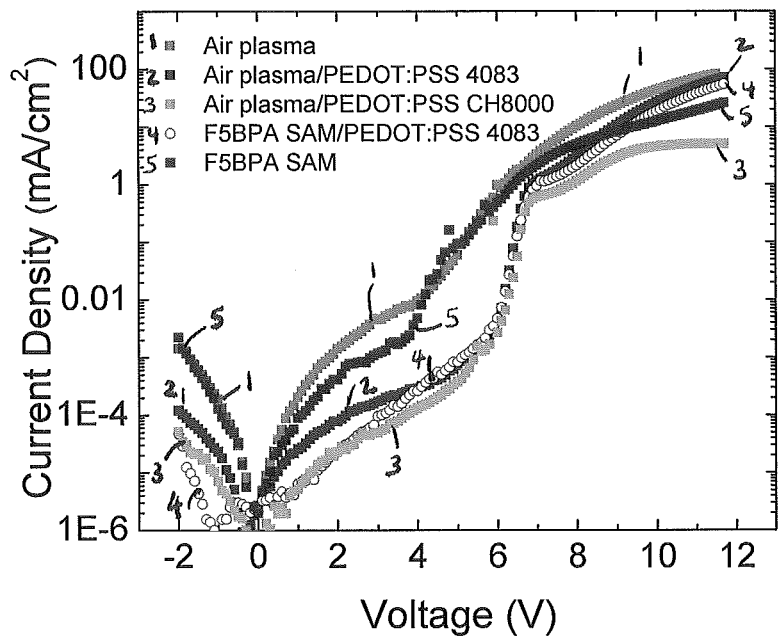
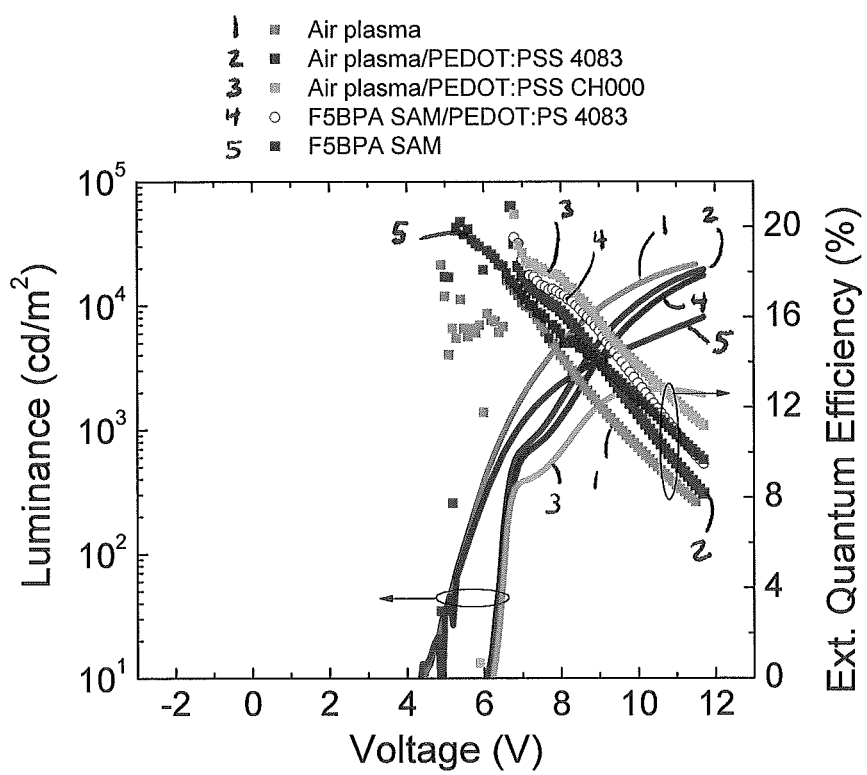

FIG 14
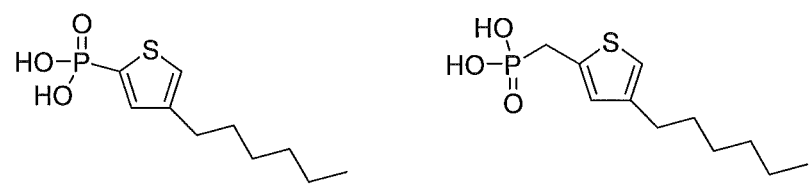
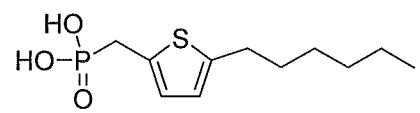
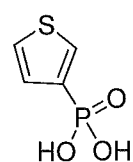
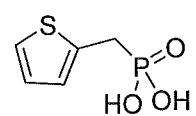
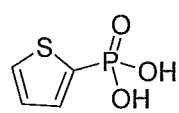

FIG 18
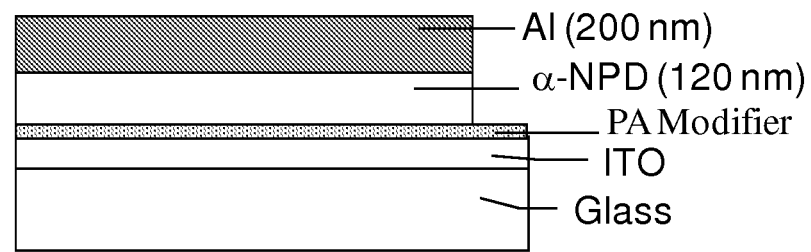
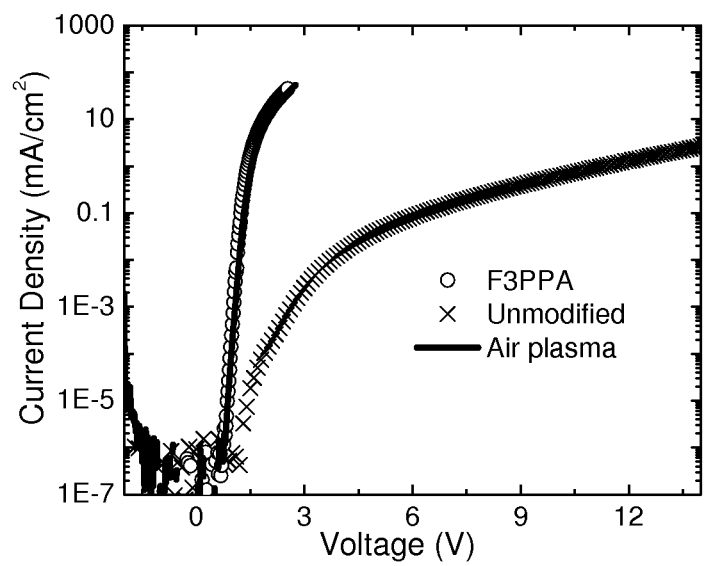

FIG 19
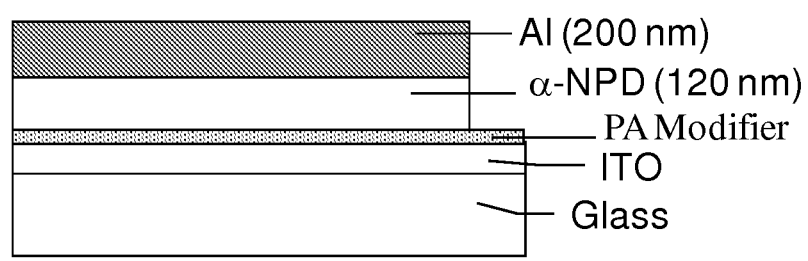
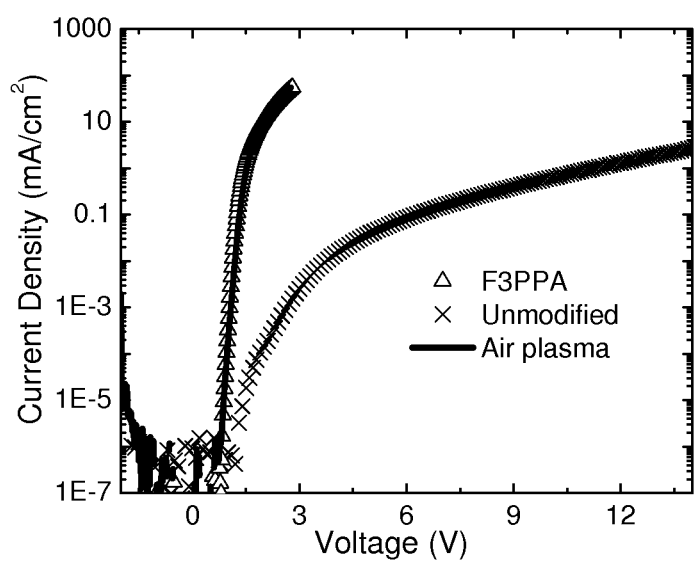

FIG 20
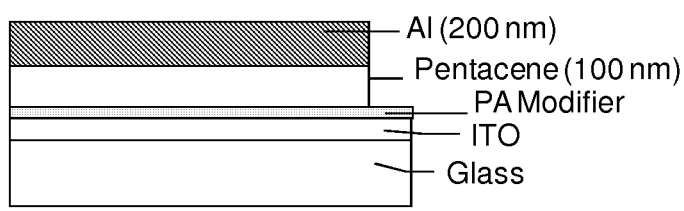
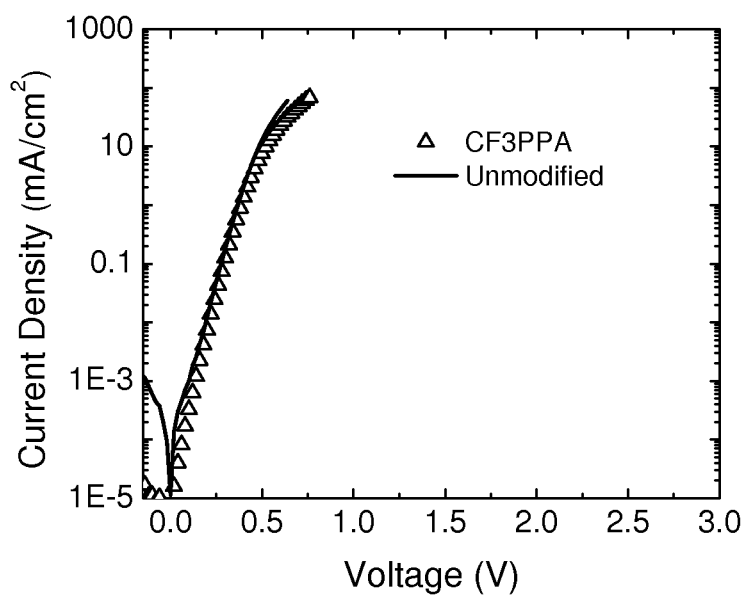

STABLE ELECTRODES WITH MODIFIED WORK FUNCTIONS AND METHODS FOR ORGANIC ELECTRONIC DEVICES

CROSS-REFERENCE TO RELATED APPLICATIONS

This application is a U.S. national stage application under 35 U.S.C. §371 of International Application No. PCT/EP2009/059027 filed Jul. 14, 2009 which claims priority to U.S. provisional application No. 61/081,808, filed Jul. 18, 2008, the whole content of which is herein incorporated by reference for all purposes.

BACKGROUND

Organic electronic devices typically comprise organic electronic materials and an anode for hole injection or collection and a cathode for electron injection or collection. Modifying the work function of an electrode to move toward or away from the energy levels of the organic electronic material can improve device performance. Changing the composition of an electrode may result in undesirable effects such as more reactivity and less electrode stability. Modifying the surface of an electrode with, for example, air plasma treatment results in unstable work functions that change and approach the work function of the untreated electrode over time. Electrodes can be treated with molecules or polymers that may form thin layers (e.g., monolayers) to modify the work function of an electrode, but these thin layers may not provide ideal chemical resistivity. Increasing chemical resistivity of a surface by using fluoroalkyl compounds is known in the art to decrease adhesion (decrease wettability), and may adversely affect some parameters of device performance.

SUMMARY

One embodiment is a method, comprising: depositing a molecule on an electrode, wherein the electrode has a surface and the molecule has a binding group (e.g., an anchoring group) that binds to the surface, thereby providing a work function that is stable for at least 100 hours under ambient conditions (in air in the laboratory). In another embodiment, the work function of electrode with the bound molecule is the same as or similar to a work function that could be obtained by other surface modification means; but the work function of electrode with the bound molecule is more stable than a work function obtained by the other surface modification means. In some embodiments, the other surface modification means is air plasma treatment. In other embodiments, the electrode comprises an oxide and the molecule is a phosphonic acid (e.g., an alkyl phosphonic acid, a heteroalkyl phosphonic acid, an aryl phosphonic acid, or a hetereoaryl phosphonic acid). Various other embodiments include organic electronic devices that comprise at least one electrode, the electrode having a surface and a molecule with a binding group bound to the surface, where the device is stable over a long period of time.

Another embodiment is a device comprising a) an electrode, the electrode having a surface; b) a molecule bound to the surface of the electrode through a binding group; and c) an organic electronic material in electrical contact with the electrode, wherein the molecule comprises at least one fluorinated aryl organic group. The fluorinated aryl groups provide superior chemical resistivity and long term stability while not adversely affecting the adhesion properties of the electrode.

Another embodiment is an organic electronic device comprising a) a transparent conductive metal oxide electrode having a surface and b) a fluorinated aryl phosphonic acid bound to the surface. In some embodiments, the fluorinated aryl phosphonic acid comprises a monolayer on the surface.

Another embodiment is a method, comprising: a) depositing a molecule on an electrode having a surface, the molecule comprising a binding and a fluorinated aryl group, whereby the binding group binds the surface and b) depositing an organic electronic material in proximity to the electrode so that the electrode and the organic electronic material are in electrical contact. The molecule may further comprise a linker group between the binding group and the fluorinated aryl group.

BRIEF DESCRIPTION OF THE DRAWINGS

FIG. 4 shows (a) the current-voltage (I-V), and (b) the luminance/external quantum efficiency (EQE) graphs for devices with ITO with surface-bound phosphonic acids compared to devices with ITO treated with air plasma.

FIG. 6 shows (a) the current-voltage (I-V), and (b) the luminance/external quantum efficiency (EQE) graphs of OLED devices fabricated with ITO with surface-bound phosphonic acids compared to devices with ITO treated with air plasma.

FIG. 7 shows the structure of the single layer diode and current-voltage (IV) graph for the diode fabricated with ITO with surface-bound phosphonic acids compared to devices with ITO treated with air plasma.

FIG. 10 shows (a) the current-voltage (I-V), and (b) the luminance/external quantum efficiency (EQE) graphs for OLED devices fabricated with ITO with surface-bound phosphonic acids compared to devices with ITO-PEDOT:PSS.

FIG. 14 shows thiophene containing phosphonic acids.

FIG. 18 outlines the synthesis of a phosphonic acid.

FIG. 19 outlines the synthesis of a phosphonic acid.

FIG. 20 outlines the synthesis of a phosphonic acid.

DETAILED DESCRIPTION

Figure 1:
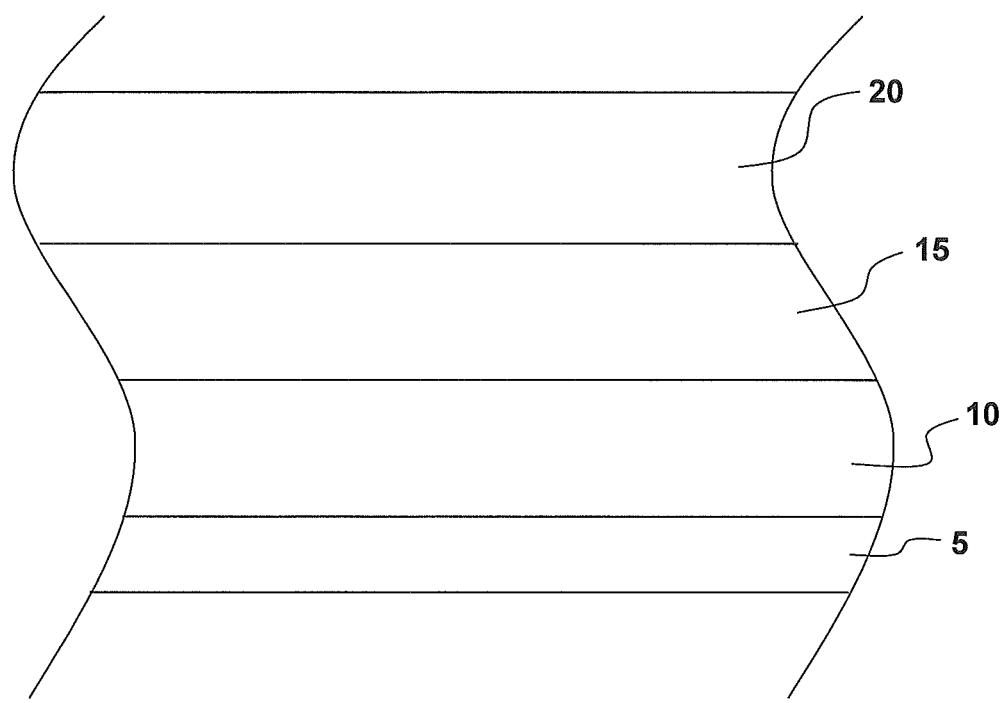
FIG. 1 illustrates a cross-section of part of an organic electronic device.

Various embodiments control the interface between organic electronic materials and a metal oxide electrode (e.g., controlling electronic properties, surface energy, wettability, adhesion properties, mechanical properties, chemical properties, or any combination thereof). One embodiment is a method, comprising: depositing a molecule on an electrode, wherein the electrode has a surface and the molecule has a binding group that binds to the surface, thereby providing a work function that is stable for at least 100 hours. Generally, "stable" refers to stability under ambient conditions or stability under inert operating conditions. In, many embodiments, the work function that is stable is different from the work function of the electrode before depositing the molecule. In another embodiment, the work function of electrode with the bound molecule is the same as or similar to a work function that could be obtained by other surface modification means (e.g., air plasma treatment); but the work function of an electrode with the bound molecule is more stable than a work function obtained by other surface modification means. In other embodiments, the work function of the electrode with the bound molecule maintains its measured work function within ±0.03 eV for more than 24 hours, whereas a work function obtained with other surface treatments decays rapidly to the value of the electrode before the other surface treatments. Typically, the molecule comprises a monolayer on the surface of the electrode. The binding group may be, for example, any of those known in the art such as, for example, a silane, a carboxylic acid, a sulfonic acid, a boronic acid, or a phosphonic acid. The molecule may comprise, for example, a binding group (also may be referred to as an anchoring group), a linker group, and substituent group. The binding group (e.g., —P(O)OH$_2$) is bonded to the linker group (e.g., —CH$_2$—) and the substituent group (e.g., —C$_6$F$_5$) is bound to the linker group. The binding group may be covalently or noncovalently bound to the surface. In many embodiments, the electrode comprises an oxide (e.g., indium tin oxide, indium zinc oxide, zinc oxide, gallium aluminum zinc oxide, antinomy tin oxide, fluorine tin oxide, cadmium oxide, or cadmium stannate, etc). In one embodiment, the work function is 4.5-5.6 eV. In other embodiments, the electrode comprises an oxide and the molecule is a phosphonic acid (e.g., an alkyl phosphonic acid, a heteroalkyl phosphonic acid, an aryl phosphonic acid, or a hetereoaryl phosphonic acid). The binding of phosphonic acids to oxide surfaces is known in the art, for example see S. H. Lee, et al., *J. Kor. Phys. Soc.* 49(5), 2034-2039 (2006) and S. Koh, et al., Langmuir, 22, 6249-6255 (2006). A wide variety of alkyl, heteroalkyl, aryl, or a hetereoaryl phosphonic acids with varying substituents may be prepared by methods known in the art, including, for example, by Michaelis-Arbuzov reaction of fluorinated aryl halides with trialkyl phosphite followed by hydrolysis (see Bhattacharya, A. K.; Thyagarajan, G. *Chem. Rev.* 1981, 81, 415-430), by photointiated Arbuzov reactions, metal catalyzed phosphorylation of aryl bromides (see Goossen, L. J., et al., *Synlett* 2005, (3), 445-448), and by hydrophosphorylation of alkenes (see Han, L.-B., et al., *J. Am. Chem. Soc.* 2000, 122, 5407-5408). The phosphonic acid may also contain an organometallic group such as ferrocene (e.g., *Inorg. Chim. Acta.* 2001, 322(1-2) 106-112). The organometallic group may be electroactive. In another embodiment, the method further comprises: b) depositing an organic electronic material in proximity to the modified electrode so that the electrode and the organic electronic material are in electrical contact. In other embodiments of the method, the electrode is an anode and the method further comprises: c) depositing a hole transport layer; d) depositing an electron transport layer; and e) depositing a cathode. For examples of organic electronic materials, methods, and devices, see: "Organic Electronics: Materials, Manufacturing and Applications" H. Klauk ed., Wiley-VCH, 2006; "Handbook of Organic Electronics and Photonics" H. S. Nalwa ed., American Scientific Publishers, 2006; "Organic Light Emitting Devices: Synthesis, Properties and Applications" K. Mullen ed., Wiley-VCH, 2006; "Organic Photovoltaics: Mechanisms, Materials, and Devices" S.-S. Sun and N. S. Sariciftci ed., CRC, 2005; and "Organic Field-Effect Transistors" Z. Bao and J. Locklin ed., CRC, 2007. "Electrical contact," when used herein regarding the electrode and the organic electronic material, means that electrical charges may flow between the electrode and the organic electronic material. The electrode and the organic electronic material may or may not be in physical contact. Electrons may flow to the electrode from the organic electronic material (e.g., hole injection) or electrons may flow from the electrode to the organic electronic material (e.g., electron injection). The organic electronic material may comprise any one of those known in the art, for example, a conducting polymer, a semi-conducting polymer, a hole transport polymer, an electron transport polymer, an emissive polymer, a solar absorbing polymer (e.g., an active layer in an organic photovoltaic), or a molecule (e.g., TPD, carbazole, pentacene, luminescent organometallics, etc.). The organic electronic material may also have, for example, a blend of two or more of hole transporters, electron transporters, emitters, solar absorbers, etc. as a guests in a host, covalently linked to a polymer, part of a polymer main chain, or any combination thereof.

Various embodiments include organic electronic devices that comprise at least one electrode, the electrode having a surface and a molecule with a binding group bound to the surface, where the device is stable over a long period of time. In one embodiment, the organic electronic device is more stable than if the electrode did not have the molecule bound to the surface. Organic electronic devices may include, for example, organic light emitting diodes, organic field effect transistors, organic photovoltaics, etc. In other embodiments, the organic electronic device with a bound molecule on the electrode has an efficiency that is the same as or similar to the efficiency of a device comprising an electrode having had a different surface treatment (e.g., air plasma treatment); but the half life ($t_{1/2}$) of the device with the bound molecule on the electrode is at least 50% greater. Typically, the molecule comprises a monolayer on the surface of the electrode. In one embodiment, referring to FIG. 1, the electrode is an anode 5 and the device further comprises: b) a hole transport layer 10 overlying the electrode. In another embodiment, the device further comprises: c) an electron transport layer 15 overlying the hole transport material and d) a cathode 20 overlying the electron transport material. Other devices layers, including for example emissive layers, may be in between any of the other devices layers. In other embodiment, the molecule, the electrode, the binding groups, and the organic electronic material may be as described above.

In one embodiment a device comprises a) an electrode, the electrode having a surface; b) a molecule bound to the surface of the electrode through a binding group; and c) an organic electronic material in electrical contact with the electrode, wherein the molecule comprises at least one fluorinated aryl group. There molecule may further comprise a linker group (e.g., —CH$_2$—, —CH$_2$CH$_2$—, —CH$_2$CF$_2$—, etc) between the binding group and the fluorinated aryl group. In some embodiments, the electrode comprises a transparent conductive metal oxide. Examples of transparent conductive metal oxides include indium tin oxide, indium zinc oxide, zinc oxide, gallium aluminum zinc oxide, antinomy tin oxide, fluorine tin oxide, cadmium oxide, or cadmium stannate, etc). In other embodiments, the electrode comprises a carbon nanotubes or graphene that is functionalized to react with the binding group (e.g., so that a phosphonic acid binds to the carbon nanotube or grapheme by through the functionalized group). In many embodiments, the molecule comprises a monolayer on the surface. The binding group of the molecule may comprise, for example, a silane, a carboxylic acid, a sulfonic acid, a boronic acid, or a phosphonic acid. In some embodiments, the fluorinated aryl group comprises a phenyl group, a naphthalene group, or a biphenyl group and the number of fluorines is from 1 to 10. In another embodiment, the binding group is a phosphonic acid and the conductive transparent oxide is indium tin oxide. The molecule comprising the fluorinated aryl group may modify the work function of the electrode and provide a work function that is comparatively stable while maintaining good wettability of the electrode surface (allows adhesion).

Another embodiment is an organic electronic device comprising a) a transparent conductive metal oxide electrode having a surface and b) a fluorinated aryl phosphonic acid bound to the surface. In some embodiments, the fluorinated aryl phosphonic acid comprises a monolayer on the surface. A wide variety of fluorinated aryl phosphonic acids may be prepared by methods known in the art such as those described above. In other embodiments, for example when the electrode is indium tin oxide (ITO), the contact angle formed by a drop of water on the surface of the fluorinated aryl phosphonic acid bound ITO is between 60° and 80°. In another embodiment, the surface energy is from 30 mJ/m$^2$ to 50 mJ/m$^2$. In other embodiments, the surface energy is from 35 mJ/m$^2$ to 45 mJ/m$^2$. In other embodiments, the polar component of the surface energy is from 0 mJ/m$^2$ to about 15 mJ/m$^2$. In some embodiments, the fluorinated aryl group comprises from 1 to 11 fluorines. In one embodiment, the fluorinated phosphonic acid has the structure

Figure 2:
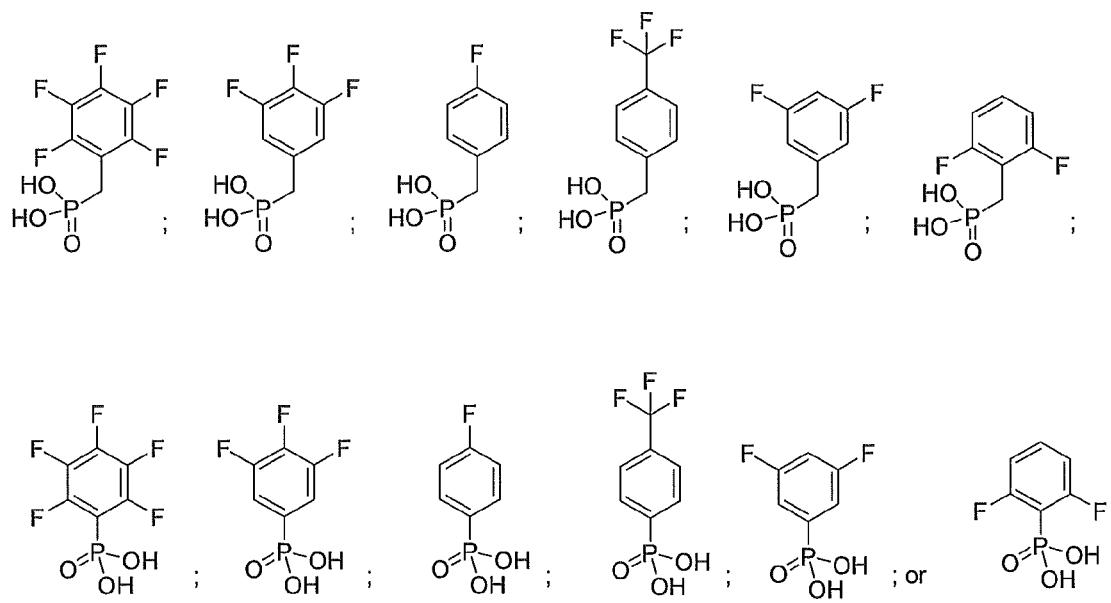
FIG. 2 shows some fluorinated aryl phosphonic acids.

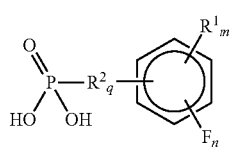

wherein, independently at each occurrence: $R^1$ is a halogen, alkyl, heteroalkyl, or a fluorinated alkyl group; $R^2$ is methylene, fluorinated methylene, alkene, or alkyne; n=0-5; m=0-3; and q=0-3, provided that at least one fluorine is present. Other embodiments include phosphonic acids comprising fluorinated aryl groups. In other embodiments, the transparent conductive metal oxide is an anode and the organic electronic device further comprises: c) a hole transport layer overlying the fluorinated aryl phosphonic acid; d) an electron transport layer overlying the hole transport layer; and e) a cathode overlying the electron transport layer. Materials used for the hole transport layer, the electron transport layer, and the cathode may be selected from polymers, small molecules, composites, metals, or any combination thereof as is known in the art. In some embodiments, the work function of the anode is between 4.4 eV and 5.6 eV. In other embodiments, the fluorinated phosphonic acid corresponds to one of the structures illustrated in FIG. 2.

Another embodiment is a method, comprising: a) depositing a molecule on an electrode, the electrode having a surface and the molecule comprising a binding group and a fluorinated aryl group, whereby the binding group binds the surface and b) depositing an organic electronic material in proximity to the electrode so that the electrode and the organic electronic material are in electrical contact. Depositing the molecule and depositing the organic electronic material may independently include techniques such as, for example, spin coating, dip coating, drop casting, evaporation, crosslinking, vacuum deposition, or any combination thereof in a single step or in discrete steps. In many embodiments, the molecule comprises a monolayer on the surface. In other embodiments, the electrode comprises a transparent conductive metal oxide. The conductive transparent conductive metal oxide and the binding may be as described above. In other embodiments, for example when the electrode is indium tin oxide (ITO), the contact angle of the fluorinated aryl phosphonic acid bound ITO is between 60° and 80°. In another embodiment, the surface energy is from 30 mJ/m$^2$ to 50 mJ/m$^2$. In other embodiments, the surface energy is from 35 mJ/m$^2$ to 45 mJ/m$^2$. In some embodiments, the fluorinated aryl group comprises a phenyl group, a naphthalene group, or a biphenyl group and the number of fluorines is from 1 to 10. In some embodiments, binding group is a phosphonic acid and the conductive transparent oxide is indium tin oxide. In another embodiment, the fluorinated aryl group may comprise from 1 to 11 fluorines. In other embodiments, the molecule is a fluorinated phosphonic acid that has the structure

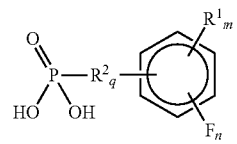

wherein, independently at each occurrence: $R^1$ is a halogen, alkyl, heteroalkyl, or fluorinated alkyl group; $R^2$ is methylene, fluorinated methylene, alkene, or alkyne; n=0-5; m=0-3; and q=0-3, provided that at least one fluorine is present. In another embodiment, the work function of the electrode is between 4.4 eV and 5.6 eV. In other embodiments, the transparent conductive metal oxide is an anode and the method further comprises: c) depositing an hole transport layer; d) depositing an electron transport layer; and e) depositing a cathode. In another embodiment, fluorinated phosphonic acid has any one of the structures in FIG. 2.

Another embodiment is a phosphonic acid having the structure

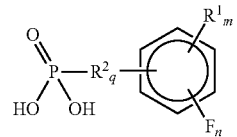

where, $R^2$ comprises 3 to 30 —$CH_2$— groups, n=0-5, m=0-5, and $R^1$ is as described above. In one embodiment, $R^2$ is bonded to the phenyl ring through an ether. $R^1$ may also be a functional group that can be reacted with other compounds or polymers or crosslinked. In one embodiment, $R^2$ comprises at least one ether linkage. In one embodiment, $R^2$ comprises —$(CH_2)_x$—$O_y$—$(CH_2)_x$—$O_y$—$(CH_2)_z$— wherein, independently at each occurrence, x=1-12, y=0-1, and z=0-4. Other embodiments are devices and methods comprising the phosphonic acid. One embodiment is a transistor comprising the phosphonic acid.

Another embodiment is a method of modifying the surface energy of an electrode so that some interaction property between the electrode and an organic electronic material (e.g., adhesion) is improved. In most embodiments, the surface energy of the electrode is modified by depositing a molecule that binds to the surface of the electrode (e.g., as described herein). The molecule may form a monolayer. In some embodiments, the work function is not significantly modified. In other embodiments, the work function is modified to increase or decrease the flow of electrons to or from the organic electronic material. One embodiment is a method, comprising: a) providing an electrode having a surface, a first work function, and a first surface energy; and b) depositing a molecule on the surface, thereby providing a modified electrode with a second work function and a second surface energy, wherein the molecule binds to the electrode through a binding group and the first surface energy and the second surface energy are different. In one embodiment, the second surface energy is different from the first surface energy so that adhesion of an organic electronic material to the modified electrode is better than the adhesion of the organic electronic material to the electrode, wherein electrons can flow between the organic electronic material and the electrode. In another embodiment, the second work function is different from the first work function so that electron flow between the organic electronic material and the electrode is improved. In other embodiments, the second surface energy is different from the first surface energy so that adhesion of an organic electronic material to the modified electrode is better than the adhesion of the organic electronic material to the electrode, wherein electrons can flow between the organic electronic material and the electrode and wherein the second work function is different from the first work function so that electron flow between the organic electronic material and the electrode is improved. In one embodiment, the electrode is a transparent conductive metal oxide and the second surface energy is from about 20 mJ/m$^2$ to about 50 mJ/m$^2$ and the work function is about 4.4 eV to about 5.6 eV. In some embodiments, the polar component of the surface energy is from 0 mJ/m$^2$ to about 15 mJ/m$^2$. In another embodiment, the molecule forms a monolayer on the surface. In another embodiment the transparent conductive metal oxide comprises indium tin oxide, indium zinc oxide, zinc oxide, gallium aluminum zinc oxide, antinomy tin oxide, fluorine tin oxide, cadmium oxide, or cadmium stannate the molecule is a phosphonic acid. In another embodiment, the molecule is an alkyl phosphonic acid, a heteroalkyl phosphonic acid, an aryl phosphonic acid, or a hetereoaryl phosphonic acid. In another embodiment, the first work function and the second work function are different and the second surface energy and the first surface energy are essentially the same.

Other embodiments include phosphonic acids, for example, as some of those shown in FIGS. 2, 9, 10, and 14 and Table 1. These phosphonic acids bind to the surface of metal oxides and/or comprise an organic electronic device as described above.

Other embodiments include thiophene containing phosphonic acids. Thiophene containing phosphonic acids bind to the surface of metal oxides and/or comprises an organic electronic device as described above. Examples of thiophene containing phosphonic acids are shown in FIG. 14. In one embodiment, a thiophene containing phosphonic acid improves compatibility and/or adhesion of the thiophene containing hole transport polymer to the surface of a metal oxide to which the thiophene containing phosphonic acid is bound.

Figure 15:
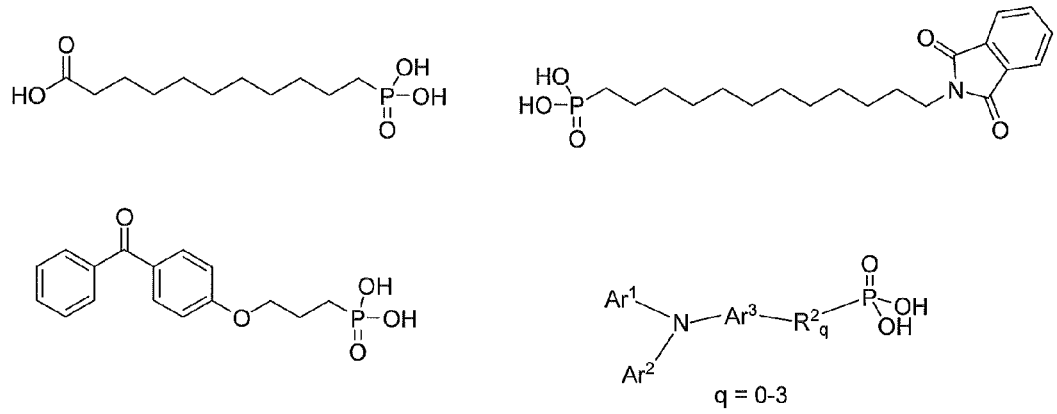
FIG. 15 shows some functional group containing phosphonic acids.
Figure 16:
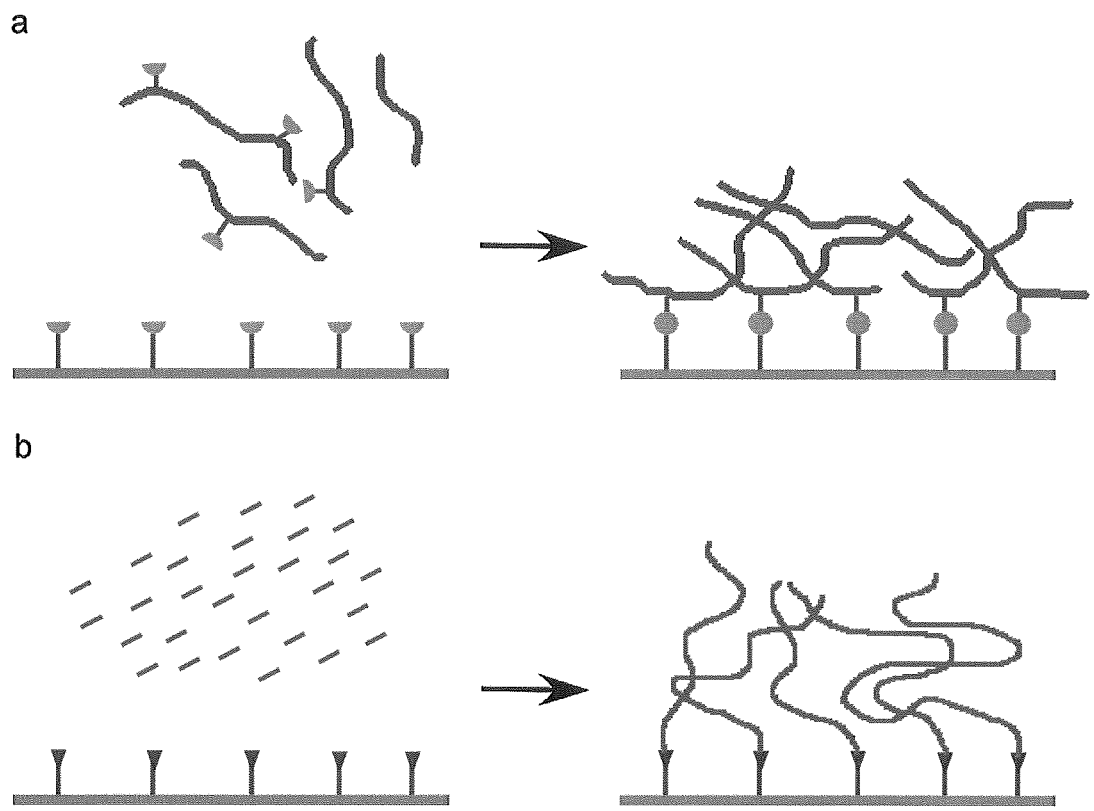
FIG. 16 shows methods of grafting polymers onto a surface comprising functional group containing phosphonic acids.

Other embodiments include a phosphonic acid comprising a functional group. A phosphonic acid comprising a functional group binds to the surface of metal oxides and/or comprises an organic electronic device as described above. The functional group may be reactive towards a wide variety of compounds including, for example, molecules, polymers, biopolymers, proteins, nucleic acids, etc. The functional groups may be, for example, electrophilic, nucleophilic, may generate radicals, may be photoreactive, or any combination thereof. The functional group may be, for example, a carboxylic acid, an acrylate, an amine, an aldehyde, a ketone, an alkene, alkyne, or any one of those known in the art. The functional groups may also be protected as, for example, esters, carbamates, phthalimides, and the like. Some examples of phosphonic acids containing functional groups are shown in FIG. 15. Other embodiments include molecules and/or polymers for reacting with the functional groups. When the phosphonic acid is bound to the surface of a metal oxide, the functional group may be reacted with a second molecule and/or polymer to bind (e.g., covalently bond) the second molecule and/or polymer to the surface. In one embodiment, a benzophenone functional group reacts with a —C—H bond in a polymer. Other embodiments include methods of reacting the functional groups with molecules and/or polymers, articles made by the methods, and organic electronic devices made by the methods. In another embodiment, the functional group is used to react with a monomer and grow polymers from the surface. An illustration of reacting the functional group with a polymer (e.g., attaching the polymer to the surface via a functional group on the surface) is shown in FIG. 16a and an illustration of polymerizing from the functional groups is shown in FIG. 16b. Other embodiments include methods of binding a molecule and/or polymer to the surface of a metal oxide comprising reacting a phosphonic acid comprising a functional group with the molecule and/or polymer, wherein the phosphonic acid is bound to the surface of the metal oxide and the functional group reacts with the molecule and/or polymer. Other embodiments include organic electronic devices or sensors (e.g., biosensors) made by processes comprising reacting a functional group containing phosphonic acid with a molecule and/or polymer, wherein the phosphonic acid is bound to the surface of a metal oxide and the functional group reacts with the molecule and/or polymer. Other embodiments include methods of growing a polymer from the surface of a metal oxide comprising reacting a functional group containing a phosphonic acid with a monomer of the polymer, wherein the phosphonic acid is bound to the surface of the metal oxide. Other embodiments include organic electronic devices or sensors (e.g., biosensors) made by a process comprising reacting a molecule, the molecule having a functional group and a phosphonic acid, with a monomer of the polymer, wherein the phosphonic acid is bound to the surface of the metal oxide. The polymerization process may include, for example, a ring opening metathesis polymerization (ROMP), a radical polymerization, an anionic polymerization, a cationic polymerization, a condensation polymerization.

Another embodiment is a phosphonic acid comprising a triarylamine and organic electronic devices comprising the triarylamine-phosphonic acid. The triarylamine may comprise the structure:

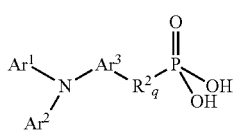

where Ar is independently at each occurrence an aryl group, $R^2$ is methylene, fluorinated methylene, alkene, or alkyne, and q=0-3. Each Ar group may be independently substituted with aryl group, hetereoaryl group, alkyl group, heteroalkyl group, or halogen. The $Ar^3$ group may be ortho, meta, or para substituted with respect to N and $R^2$ when $Ar^3$ is a benzene ring. In another embodiment, one or more of $Ar^1$, $Ar^2$, and/or $Ar^3$ are substituted with $-NAr^4_2$, wherein $Ar^4$ is independently at each occurrence an aryl or a hetereoaryl group. In some embodiments, $Ar^1$ is substituted with $-NAr^4_2$ and $Ar^1$ is a benzene ring, a biphenyl, or a naphthyl. In some embodiments, neighboring Ar groups may be linked (e.g., with a single bond, an ethylene linkage, a heteroalkyl bridge, multiple bond/s, or atoms in an aryl or hetereoaryl ring) to form one or more rings (e.g., if $Ar^1$ and $Ar^2$ are joined together by a single bond to form a carbazole).

Other embodiments include polymers comprising phosphonic acids and organic electronic devices or sensors comprising a polymer comprising phosphonic acids bound to the surface of a metal oxide. The polymers may be, for example, homopolymers or copolymers. Copolymers may comprise monomers or different compositions, monomers that are isomers, monomers that are stereoisomers, or any combination thereof. The copolymers may include, for example, other functional groups (such as described above), compatibilizing groups (e.g., PEG), or anti-fouling groups (e.g., fluorinated groups) or any combination thereof. Other embodiments include methods of binding polymers comprising phosphonic acids to the surface of a metal oxide and article made by the method.

EXAMPLES

The following examples are illustrative and do not limit the claims.

Methods used to characterize the electrode surface

X-ray photoelectron spectroscopy (XPS) and UV-photoelectron spectroscopy (UPS): XPS with a monochromatic Al(Kα) source (300 W) and UPS (He I excitation source) were performed as stated elsewhere [Alloway, D. M.; Hofmann, M.; Smith, D. L.; Gruhn, N. E.; Graham, A. L.; Colorado, R.; Wysocki, V. H.; Lee, T. R.; Lee, P. A.; Armstrong, N. R. *J. Phys. Chem. B* 2003, 107, 11690-11699] using a Kratos Axis-Ultra spectrometer, with the Fermi energy (EF) calibrated frequently using an atomically clean gold sample. All ITO samples were in electronic equilibrium with the spectrometer, i.e. that the Fermi energy for each sample was known. All XPS spectra were acquired before UPS data acquisition. All characterizations were performed at normal takeoff angle)(0°) unless otherwise noted.

Contact angle: These measurements were conducted on a KRÜSS Drop Shape Analysis System DSA 10 Mk2, using water and hexadecane as probe liquids (0.5 μL). Several drops (typically 6 repetitions) were quickly placed on the surface, the needle pulled back, and the drop shape captured immediately with the camera. Images were analyzed with the Drop Shape Analysis software to determine the contact angle by the method most suitable for each given drop, usually circle fitting, and averaging the results. The contact angle data was used to calculate the components of the surface energy by the harmonic means method.

Preparation of ITO with Bound Molecule

ITO coated glass substrates (20Ω/□, Colorado Concept Coatings, L.L.C.) were first cleaned in an ultrasonic bath using a dilute solution of Triton-X (Aldrich) in DI water for 20 minutes. The ITO substrates were then thoroughly rinsed in DI water and a final ultrasonication for 20 min. in DI water. Further organic cleaning was done in the ultrasonic bath using acetone and ethanol, 20 minutes each. After every step during the cleaning, the samples were blown using a nitrogen gun to blow off remaining solvent from the ITO surface.

Washed ITO substrates were then dried in a vacuum drying oven at 70° C. under a pressure of ($1 \times 10^{-2}$ Torr) for overnight.

SiOx Barrier Layer Formation

For the device structure, a passivation layer of 300 nm SiOx was deposited some parts of the substrate by e-beam on ITO with a shadow mask to define areas in which electrical contact could be physically made to the top cathode without creating electrical shorts between the anode and the cathode for various devices. The deposition of SiOx was done at the rate of 4 Å/s and, at pressure below $1 \times 10^{-6}$.

Monolayer Formation:

The organophosphonic acid (1 mM in $CHCl_3:C_2H_5OH::2:1$) was stirred overnight at room temperature; the resulting solution was filtered through 0.2 micrometer PTFE; ITO substrates as prepared above were submerged in the phosphonic acid solution at room temperature and the solution was allowed to evaporate until 1 hr Substrates were then annealed on the hot plate at 120° C. for 1 hr. The temperature was then brought down to room temperature before any organic layer deposition for devices or work function measurements. All the monolayer formation steps and solution processing were performed in a nitrogen filled glove box (GB) having $H_2O$ level below 1 ppm and air level below 20 ppm.

Electrode Work Function Stability and Device Stability

Figure 3:
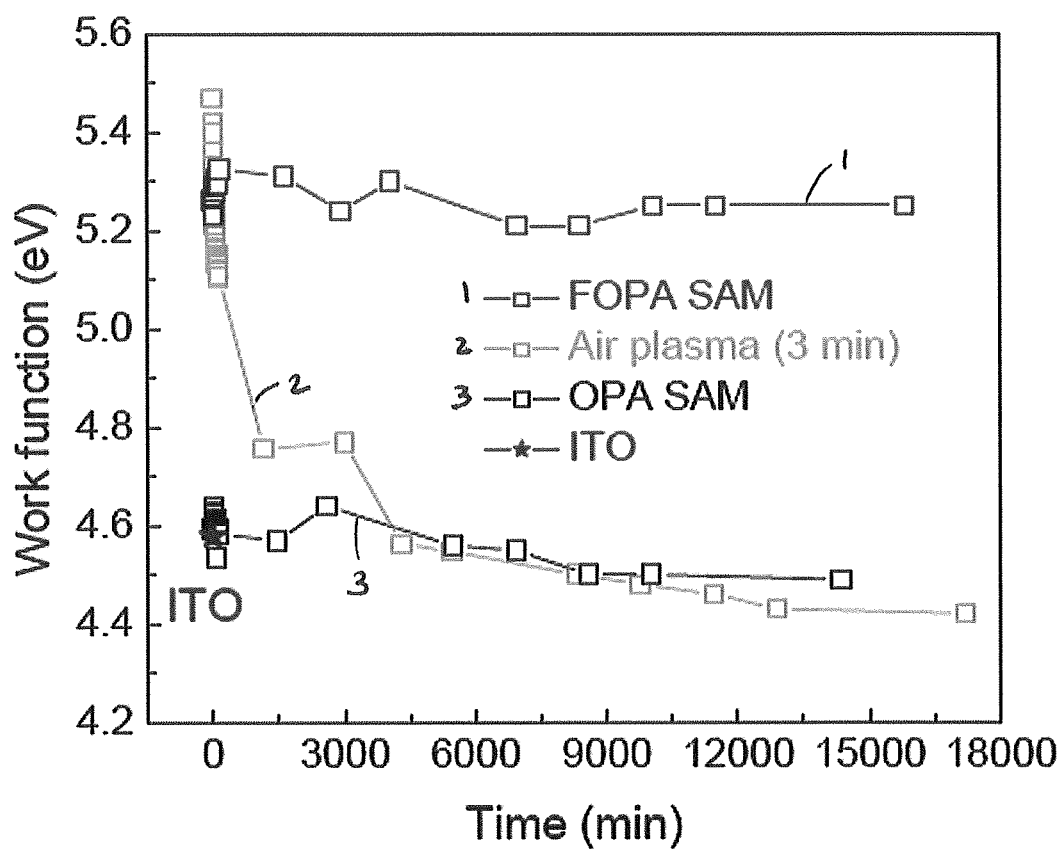
FIG. 3 shows stability of the work function of ITO with surface-bound phosphonic acids compared to ITO treated with air plasma.
Figure 5:
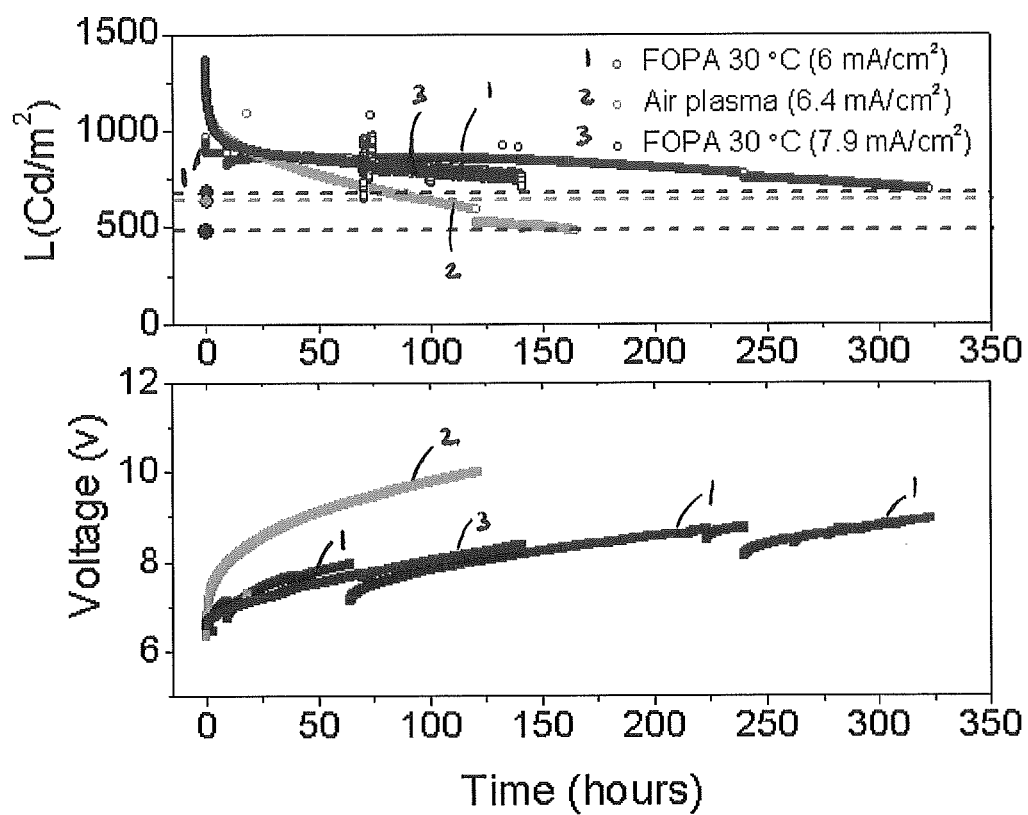
FIG. 5 shows the stability of devices with ITO with surface-bound phosphonic acids compared to devices with ITO treated with air plasma.

FIG. 3 shows examples of the much improved stability of the work functions of both ITO with bound molecules of octyl phosphonic acid (OPA) and ITO with bound molecules of 3,3,4,4,5,5,6,6,7,7,8,8-tridecylfluorooctyl phosphonic acid (FOPA) compared to ITO treated with air plasma. The lifetime of devices fabricated with FOPA bound to the surface of ITO (FIG. 5) showed increased stability.

Fluorinated Aryl Phosphonic Acids

Examples of other molecules that were bound to the surface of Indium Tin Oxide (ITO) are shown in Table 1.

TABLE 1

| Molecule | Synthesis |
|---|---|
| ![F5BPA structure: pentafluorobenzyl phosphonic acid] F5BPA | Rice, Bobbie L.; Guo, Cai Yun; Kirchmeier, Robert L. Inorganic Chemistry (1991), 30(24), 4635-8. |

TABLE 1-continued

| Molecule | Synthesis |
|---|---|
| 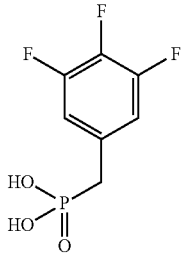<br>F3BPA | Synthesis described below |
| 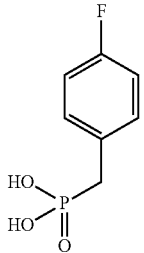<br>F1BPA | Montoneri, E.; Savarino, P.; Viscardi, G.; Gallazzi, M. C. Organosulfur phosphorus acid compounds. Part 4. Fluorobenzylphosphonosulfonic acids. Phosphorus, Sulfur and Silicon and the Related Elements (1994), 86(1-4), 145-55. |
| 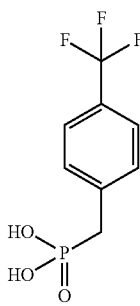<br>CF3BPA | Schwender, Charles; Demarest, Keith; Wustrow, David. Preparation of trifluoromethylbenzylphosphonates useful treating osteoporosis. Eur. Pat. Appl. (1993), 12 pp. CODEN: EPXXDW EP 524023 A1 19930120 CAN 118:234243 AN 1993:234243. |
| 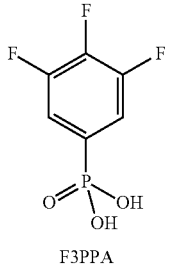 [SMILES: O=P(O)(O)c1cc(F)c(F)c(F)c1]<br>F3PPA | Synthesis described below |
| 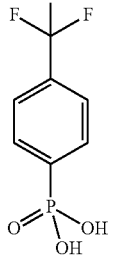<br>CF3PPA | ChemPacific Product List #60139, CAS #1869-27-8 |

Synthesis of Diethyl 3,4,5-trifluorobenzylphosphonate 3,4,5-trifluorobenzyl iodide (5.075 g, 22.55 mmol) was combined with triethylphosphite (11.6 mL, 67.7 mmol) and the mixture heated and stirred at 135° C. overnight. The mixture was put under hi-vacuum and heated to 70° C. for 12 hours. The final product was a clear oil (6.10 g, 96% yield). $^1$H NMR (400.14 MHz, CDCl$_3$) δ 6.93 (m, 2H), 4.07 (quint, J=7.10 Hz, 4H), 3.06 (d, J=21.7 Hz, 2H), 1.28 (t, J=7.05 Hz, 6H). $^{13}$C {$^1$H} NMR (100.62 MHz, CDCl$_3$) δ 150.8 (dddd, J=249.7, 9.8, 3.8, 3.8 Hz, 2C), 138.74 (dtd, J=250.6, 15.2, 3.9 Hz), 128.2-127.9 (m), 113.9-113.6 (m, 2C), 62.30 (d, J=6.74 Hz, 2C), 32.93 (d, J=139.8 Hz), 16.20 (d, J=6.01 Hz, 2C). $^{31}$P{$^1$H} NMR (202.45 MHz, CDCl$_3$): δ 24.96. Analysis calculated (found) %: C, 46.82 (46.72), H, 5.00 (4.96). MS (FAB, m/z): 269 (M$^+$, 100%). Exact mass calculated (found) for [M+H]$^+$, m/z): 269.05544 (269.05616).

Synthesis 3,4,5-trifluorobenzylphosphonic acid (F3BPA)

Diethyl 3,4,5-trifluorobenzylphosphonate (2.80 g, 9.92 mmol) was dissolved in dry dichloromethane (30 mL). Bromotrimethylsilane (4.1 mL, 31.7 mmol) was added via syringe. The reaction was capped with a greased glass stopper and allowed to stir for 6 hours. The volatiles were removed under reduced pressure to yield a yellow oil. This was dissolved in 10:1 methanol: water (20 mL) and allowed to stir overnight. After removing the solvents, recrystallization in acetonitrile yielded large white needles (2.00 g, 89% yield). $^1$H NMR (400.14 MHz, DMSO) δ 7.16 (m, 2H), 2.99 (d, J=21.4 Hz, 2H). $^{13}$C{$^1$H} NMR (100.62 MHz, DMSO) δ 149.9 (dddd, J=246, 9.6, 3.6, Hz, 2C), 137.5 (dtd, J=247, 15.4, 3.7), 132.1-131.8 (m), 114.4-114.1 (m, 2C), 34.42 (d, J=132 Hz). $^{31}$P{$^1$H} NMR (161.97 MHz, DMSO): δ 20.54. Analysis calculated (found) %: C, 37.19 (37.17), H, 2.67 (2.63). MS (FAB, m/z): 227 (M$^+$, 100%). Exact mass calculated (found) for [M+H]$^+$, m/z): 227.00849 (227.00670).

Synthesis of diethyl 3,4,5-trifluorophenylphosphonate

Trifluorobromobenzene (1.70 mL, 14.2 mmol), diethyl phosphite (2.20 mL, 17.1 mmol), N,N-dicyclohexylmethylamine (4.60 mL, 21.3 mmol) and ethanol (50 mL) were all combined in a nitrogen purged round bottom flask. After stirring for 5 minutes, triphenylphosphine (223 mg, 0.85 mmol) and palladium acetate (64 mg, 0.28 mmol) were added to the flask as one. The solution was heated to 76° C. and allowed to stir overnight. The solution started as a translucent brown color but was clearer by morning. Upon cooling, a silica plug (starting with hexanes as eluent, and increasing the polarity with ethyl acetate as needed) was run and a UV-active spot (R$_f$=0.35 in 1:1 hexanes:ethyl acetate) was isolated. The final product is a clear oil (3.477 g, 91% yield). $^1$H NMR (400.14 MHz, CDCl$_3$) δ 7.44 (dt, J=14.4, 6.50 Hz 2H), 4.19-4.07 (m, 4H), 1.34 (t, J=7.07 Hz, 6H). $^{13}$C{$^1$H} NMR (100.62 MHz, CDCl$_3$) δ 151.1 (dddd, J=254.7, 25.4, 10.1, 2.9 Hz, 2C), 142.5 (dtd, J=258.6, 15.1, 3.3 Hz), 125.0 (dtd, J=194.5, 5.8, 5.2 Hz), 116.3-116 (m, 2C), 62.72 (d, J=5.63 Hz, 2C), 16.16 (d, J=6.34 Hz, 2C). $^{31}$P {$^1$H} NMR (161.97 MHz, CDCl$_3$): δ 14.94. Analysis calculated (found) %: C, 44.79 (44.51), H, 4.51 (4.65). MS (FAB, m/z): 283 (M$^+$, 100%). Exact mass calculated (found) for [M+H]$^+$, m/z): 283.07109 (283.07135).

Synthesis of 3,4,5-trifluorophenylphosphonic acid (F3PPA)

12 M HCl (12 mL, excess) was added to diethyl 3,4,5-trifluorophenylphosphonate (320 mg) in a round bottom flask. The reaction mixture was refluxed for 12 hours. A brown oil was obtained after cooling and removal of the solvent. $^1$H NMR showed the presence of unreacted starting material. 12 mL of 8 M HCl was added and the reaction mixture refluxed again for several days. The mixture was allowed to cool and stand for several weeks. An off-white solid was obtained after removal of the solvent (190 mg, 76% yield). $^1$H NMR (400.14 MHz, DMSO) δ 7.49-7.42 (m, 2H). $^{13}$C{$^1$H} NMR (100.62 MHz, DMSO) δ 150.1 (dddd, J=251.0, 23.7, 7.3, 2.6 Hz, 2C), 140.5 (dtd, J=253.1, 15.3, 2.6 Hz), 131.8 (dm, J=178.4 Hz), 115.3-114.9 (m, 2C). $^{31}$P{$^1$H} NMR (161.97 MHz, DMSO): δ 9.22. Analysis calculated (found) %: C, 33.98 (33.94), H, 1.90 (1.80). MS (FAB, m/z): 213 (M$^+$, 100%). Exact mass calculated (found) for [M+H]$^+$, m/z): 212.99284 (212.99418).

Synthesis of diethyl 3,5-difluorobenzylphosphonate 3,5-difluorobenzyl bromide (3.0 mL, 23.2 mmol) was combined with triethylphosphite (9.1 mL, 53.3 mmol) and the mixture heated and stirred at 135° C. overnight. The mixture was put under hi-vacuum and heated to 70° C. for 12 hours. The final product was a clear oil (5.78 g, 94% yield). $^1$H NMR (400.14 MHz, CDCl$_3$) δ 6.83 (m, 2H), 6.71 (dt, J=9.00, 2.28 Hz), 4.06 (m, 4H), 3.12 (d, J=21.94 Hz, 2H), 1.28 (t, J=7.09 Hz, 6H). $^{31}$P{$^1$H} NMR (161.97 MHz, CDCl$_3$): δ 25.22.

Synthesis of 3,5-difluorobenzylphosphonic acid

Diethyl 3,5-difluorobenzylphosphonate (3.00 g, 11.4 mmol) was dissolved in dry dichloromethane (25 mL). Bromotrimethylsilane (4.9 mL, 37 mmol) was added via syringe. The reaction was capped with a greased glass stopper and allowed to stir for 6 hours. The volatiles were removed under reduced pressure to yield a yellow oil. This was dissolved in 8:1 methanol:water (25 mL) and allowed to stir overnight. After removing the solvents, recrystallization in acetonitrile yielded a white crystalline solid (1.98 g, 91% yield). $^1$H NMR (400.14 MHz, DMSO) δ 7.05 (dt, J=9.49, 2.09 Hz), 6.95 (d, J=8.54 Hz, 2H), 3.02 (d, J=21.57 Hz, 2H). $^{31}$P {$^1$H} NMR (161.97 MHz, DMSO): δ 20.63. Analysis calculated (found) %: C, 40.40 (40.67), H, 3.39 (3.39).

Synthesis of diethyl 2,6-difluorobenzylphosphonate 2,6-difluorobenzyl bromide (3.0 g, 14.5 mmol) was combined with triethylphosphite (6.2 mL, 36.2 mmol) and the mixture heated and stirred at 135° C. overnight. The mixture was put under hi-vacuum and heated to 80° C. for 10 hours. The final product was a slightly yellow-tinted oil (3.30 g, 86% yield). $^1$H NMR (400.14 MHz, DMSO) δ 7.36 (m), 7.10 (m, 2H), 3.96 (m, 4H), 3.20 (d, J=21.08 Hz, 2H), 1.16 (t, J=7.05 Hz, 6H). $^{13}$C {$^1$H} NMR (100.62 MHz, CDCl$_3$) δ 161.0 (ddd, J=249.0, 7.3, 6.2 Hz, 2C), 128.4 (dt, J=10.2, 3.82 Hz), 111.0 (ddd, J=18.9, 6.0, 3.5 Hz, 2C), 108.5 (dt, J=19.8, 10.5 Hz), 62.1 (d, J=6.5 Hz, 2C), 20.6 (dt, J=142.1, 2.3 Hz), 16.0 (d, J=6.2 Hz, 2C). $^{31}$P{$^1$H} NMR (161.97 MHz, DMSO): δ 24.68. Analysis calculated (found) %: C, 50.01 (49.71), H, 5.72 (5.78). MS (FAB, m/z): 265 (M$^+$, 100%). Exact mass calculated (found) for [M+H]$^-$, m/z): 265.08051 (265.08278).

Synthesis of 2,6-difluorobenzylphosphonic acid

Diethyl 2,6-difluorobenzylphosphonate (2.00 g, 7.57 mmol) was dissolved in dry dichloromethane (20 mL). Bromotrimethylsilane (3.3 mL, 25 mmol) was added via syringe. The reaction was capped with a greased glass stopper and allowed to stir for 6 hours. The volatiles were removed under reduced pressure to yield a yellow oil. This was dissolved in 10:1 methanol:water (20 mL) and allowed to stir overnight. After removing the solvents, recrystallization in acetonitrile yielded a white crystalline solid (1.199 g, 76% yield). $^1$H NMR (400.14 MHz, DMSO) δ 7.29 (m), 7.04 (m, 2H), 2.96 (d, J=20.99 Hz, 2H). $^{31}$P{$^1$H} NMR (161.97 MHz, DMSO): δ 19.51. Analysis calculated (found) %: C, 40.40 (40.64), H, 3.39 (3.34).

Synthesis of diethyl 2,6-difluorophenylphosphonate 2,6-difluoroiodobenzene (3.0 g, 12.5 mmol) was combined with triethylphosphite (10.7 mL, 62.5 mmol) in a pressure vessel which had been flushed with nitrogen. The vessel was sealed and rotated in the photoreactor (16 bulbs-350 nm) for 20 hours. The reaction mixture was put under hi-vacuum (0.08 Torr) at 50° C. for 5 hours. A column was run in hexanes and ethyl acetate (increasing polarity as run). The top spot, which was UV active, was separated. After removing solvent, a yellow-tinted liquid was left (2.30 g, 74% yield). $^1$H NMR (400.14 MHz, DMSO) δ 7.72 (m), 7.21 (m, 2H), 4.10 (m, 4H), 1.25 (t, J=7.04 Hz). $^{31}$P{$^1$H} NMR (161.97 MHz, DMSO): δ 8.23. The phosphonate can be hydrolyzed as described above to provide the corresponding phosphonic acid.

Synthesis of 4-fluorophenylphosphonic acid

Diethyl 4-fluorophenylphosphonate (600 mg, 2.55 mmol) was combined with 8M HCl (10 mL, excess) and the mixture refluxed overnight. The reaction was cooled and filtered to remove dark specks. The solvent was removed under vacuum until a solid began to form. The mixture was then put in the refrigerator for several hours. The solid was dried to yield an off-white powder (P80 mg). $^1$H NMR (400.14 MHz, DMSO) δ 7.71 (ddd, J=12.49, 8.52, 5.99 Hz, 2H), 7.28 (ddd, J=9.02, 9.02, 2.65 Hz, 2H). $^{31}$P{$^1$H} NMR (161.97 MHz, DMSO): δ 12.81. Analysis calculated (found) %: C, 40.93 (40.33), H, 3.43 (3.49).

The filtrate was dried under vacuum to yield a beige powder (250 mg). Analysis calculated (found) %: C, 40.93 (39.47), H, 3.43 (3.48).

Synthesis of Perfluorophenylphosphonic Acid

Diethyl perfluorophenylphosphonate (1060 mg, 3.48 mmol) was combined with 8M HCl (10 mL, excess) and the mixture refluxed overnight. The reaction was cooled and filtered to remove dark specks. The solvent was removed under vacuum until a solid began to form. The mixture was then put in the refrigerator for several hours. The solid was dried to yield an off-white powder (130 mg). $^1$H NMR showed no signal other than the DMSO. $^{31}$P{$^1$H} NMR (161.97 MHz, DMSO): δ−0.93. Analysis calculated (found) %: C, 29.05 (29.89), H, 0.81 (1.02).

The filtrate was dried under vacuum to yield a beige powder (740 mg). Analysis calculated (found) %: C, 29.05 (29.33), H, 0.81 (0.95).

Device Efficiency

OLED devices were fabricated with ITO electrodes having surface bound phosphonic acids (PA). The phosphonic acid modified ITO samples were then transferred for loading into the evaporation chamber through the T-antechamber that connects the double glove box in line with the evaporation chamber. First, a hole transport layer (HTL) of N,N'-diphenyl-N, N'-bis(1-naphthyl)-1,1'biphenyl-4,4"diamine (α-NPD) (40 nm) was deposited at the rate of 1 Å/s by thermal evaporation. An emitting layer was formed by coevaporation of (6 wt %) fac tris(2-phenylpyridinato-N,$C^{2'}$)iridium[Ir(ppy)$_3$] in 4,4'-di(carbazol-9-yl)-biphenyl (CBP) to give a 20 nm-thick film. The evaporation rate at the substrate was 1 Å/s. A hole blocking layer of bathocuproine (2,9-dimethyl-4,7-diphenyl-1,10-phenanthroline, BCP) (40 nm) was subsequently deposited over the emissive layer at a rate of 0.4 Å/s. During the deposition of the organic layers, the pressure was kept below $1 \times 10^{-7}$ Torr. Finally a thin layer of lithium fluoride (LiF, 3 nm) acting as an electron injection layer followed by Al (200 nm) as cathode were deposited. LiF and Al were deposited, at pressures below $1 \times 10^{-6}$ Torr and at rates of 0.1 Å/s and 2 Å/s, respectively. A shadow mask was used for Al deposition to make five devices per substrate with an active area of 0.1 cm² for each device. The final configuration of the device was Glass/ITO/Monolayer/α-NPD(40 nm)/CBP:Ir(ppy)$_3$(20 nm)/BCP (40 nm)/LiF(3 nm)/Al (200 nm).

The current-voltage-light (I-L-V) characteristics were measured in the glove box without exposing the devices to air.

The devices showed the very similar efficiency compared to devices fabricate with air plasma treated ITO (FIG. 6, see Table 1 for the structures reference in FIG. 6); however, since the work function was more stable with the fluorinated aryl phosphonic acid treated ITO than with the air plasma treated ITO, the fabrication was more facile.

TABLE 2

Figure 8:
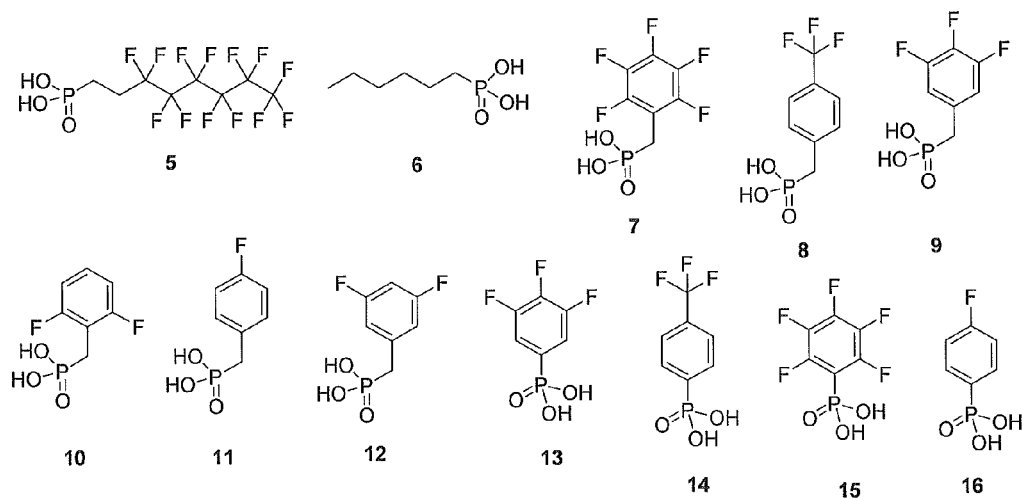
FIG. 8 shows some phosphonic acids.

Values of the work functions and valence band maximas (VBMs) for the compounds presented in FIG. 8.

| Compound # | Work Function (eV) (+/−0.1 eV) | VBM (eV) (+/−0.1 eV) |
|---|---|---|
| 1 | 4.5 | 3 |
| 2 | 5.5 | 2.9 |
| 3 | 5.5 | 2.7 |
| 4 | 5.8 | 2.7 |
| 5 | 5.6 | 3.1 |
| 6 | 4.9 | 2.9 |
| 7 | 5.2 | 3.1 |
| 8 | 5.6 | 2.7 |
| 9 | 5.3 | 2.8 |
| 10 | 4.4 | 3.1 |
| 11 | 5.0 | 2.9 |
| 12 | 5.2 | 2.9 |
| 13 | 5.4 | 3.0 |
| 14 | 5.6 | 3.0 |
| 15 | 5.1 | 3.1 |
| 16 | 5.0 | 3.0 |

Entry 1 = DSC ITO;
Entry 2 = DSC OP ITO-2;
Entry 3 = DSC OP-ITO-2;
Entry 4 = DSC OP-ITO-3.
DSC ITO is detergent/solvent cleaned ITO (see below),
DSC OP-ITO is DSC ITO plus 15 minutes of OP etching.
All the other samples are OP-ITO modified with the PA shown.
The numbers in the Sample column reference the compounds in FIG 8.
In some cases OP increases the coverage of the monolayer and affects surface energies and work function differently than DSC alone.

Figure 9:
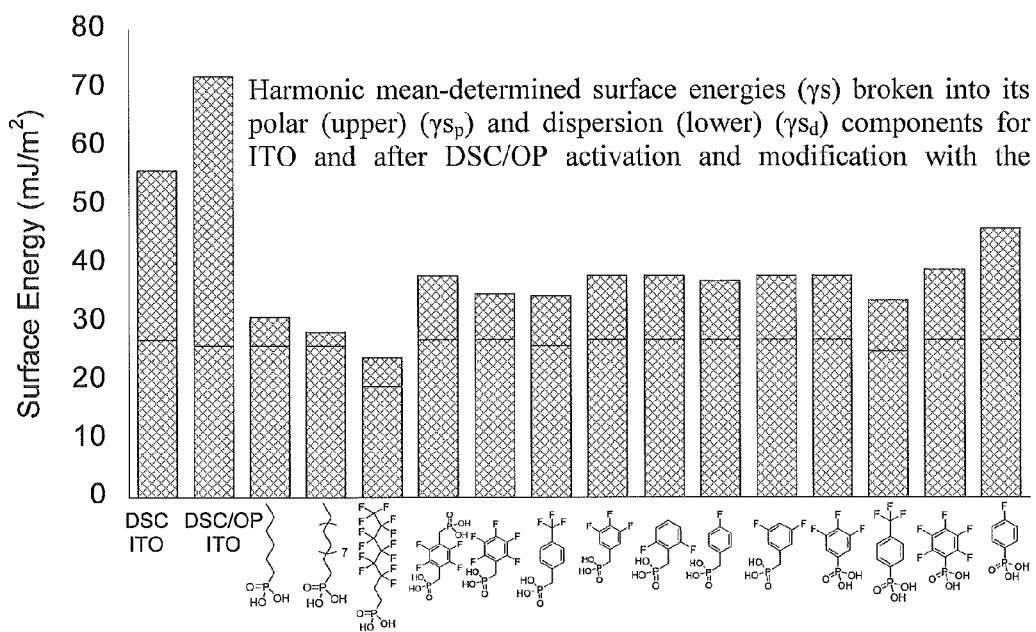
FIG. 9 shows the surface energies of some phosphonic acids bound to the surface of a metal oxide.

FIG. 9 shows the surface energy graph of the various samples (listed above). The upper, blue portion is the polar component and the lower, orange portion is the dispersive component. FIG. 9 shows the surface energy of some of the phosphonic acids in Table 2 bound to the surface of ITO.

TABLE 3

Number of fluorines, ratio of the areas of the F1s peak to the In3p peak, the adjusted ratio (taking the number of fluorines on the molecule into account), and the relative ratios (by setting one of the adjusted ratios to 1.00, and adjusting the others in a likewise fashion.

| Sample | # F | ratio F1s/In3p | adjusted ratio | relative ratio |
|---|---|---|---|---|
| 7 | 5 | 0.188 | 37.6 | 0.75 |
| 8 | 3 | 0.155 | 51.7 | 1.03 |
| 9 | 3 | 0.157 | 52.3 | 1.05 |
| 10 | 2 | 0.065 | 32.5 | 0.65 |
| 11 | 1 | 0.050 | 50.0 | 1.00 |
| 12 | 2 | 0.088 | 44.0 | 0.88 |
| 13 | 3 | 0.150 | 50.0 | 1.00 |
| 14 | 3 | 0.170 | 56.7 | 1.13 |
| 15 | 5 | 0.188 | 37.6 | 0.75 |
| 16 | 1 | 0.025 | 25.0 | 0.50 |

The numbers in the Sample column reference the compounds in FIG 8.

By calculating the areas of the F1s and In3p(3/2) peaks and comparing them to one another, a general picture can be seen as to how good of a monolayer each PA yielded with respect to one-another (Table 1). However, several things should be taken into account. First of all, the intensities should all be adjusted to take into account the number of fluorines on each modifier. Additionally, those modifiers which have ortho-substituted fluorines may show decreased relative ratios because of the direction in which the fluorines are pointing. Because these atoms may be shielded from the X-rays, their intensity may be less than expected.

Figure 11:
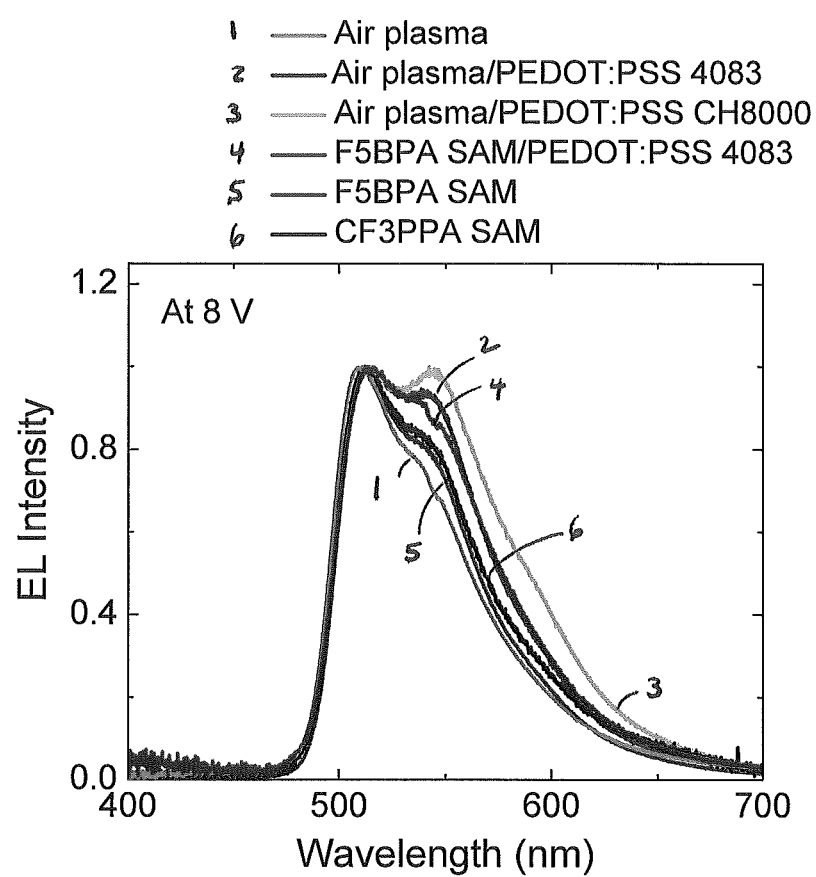
FIG. 11 shows the electroluminescence (EL) spectra for OLED devices fabricated with ITO with surface-bound phosphonic acids compared to devices with ITO-PEDOT:PSS.

FIG. 10 shows the IV and luminance/EQE graphs for OLED devices fabricated with ITO with surface-bound phosphonic acids compared to devices with ITO-PEDOT:PSS (20 nm). The efficiencies of the devices at 1000 cd/m² are 20%, 18.9%, 17%, and 17.8% for air plasma, PEDOT:PSS 4083 (CLEVIOS PVP AI 4083, formerly Baytron, Lot#HCD07P109), PEDOT:PSS CH8000 (CLEVIOS PVP CH 8000, formerly Baytron, Lot #BPSV0003), for F5BPA. The electroluminescent spectra of devices fabricated with ITO with surface-bound phosphonic acids and ITO-PEDOT are shown in FIG. 11. The electroluminescent spectra for PEDOT devices are modified compared to the air plasma and phosphonic acid bound ITO devices. This modification affects the color output of the device. Thus, ITO phosphonic acid electrodes have the nearly the same efficiency of air plasma and PEDOT devices without the work function stability issues of air plasma and the color modification of PEDOT.

Figure 12:
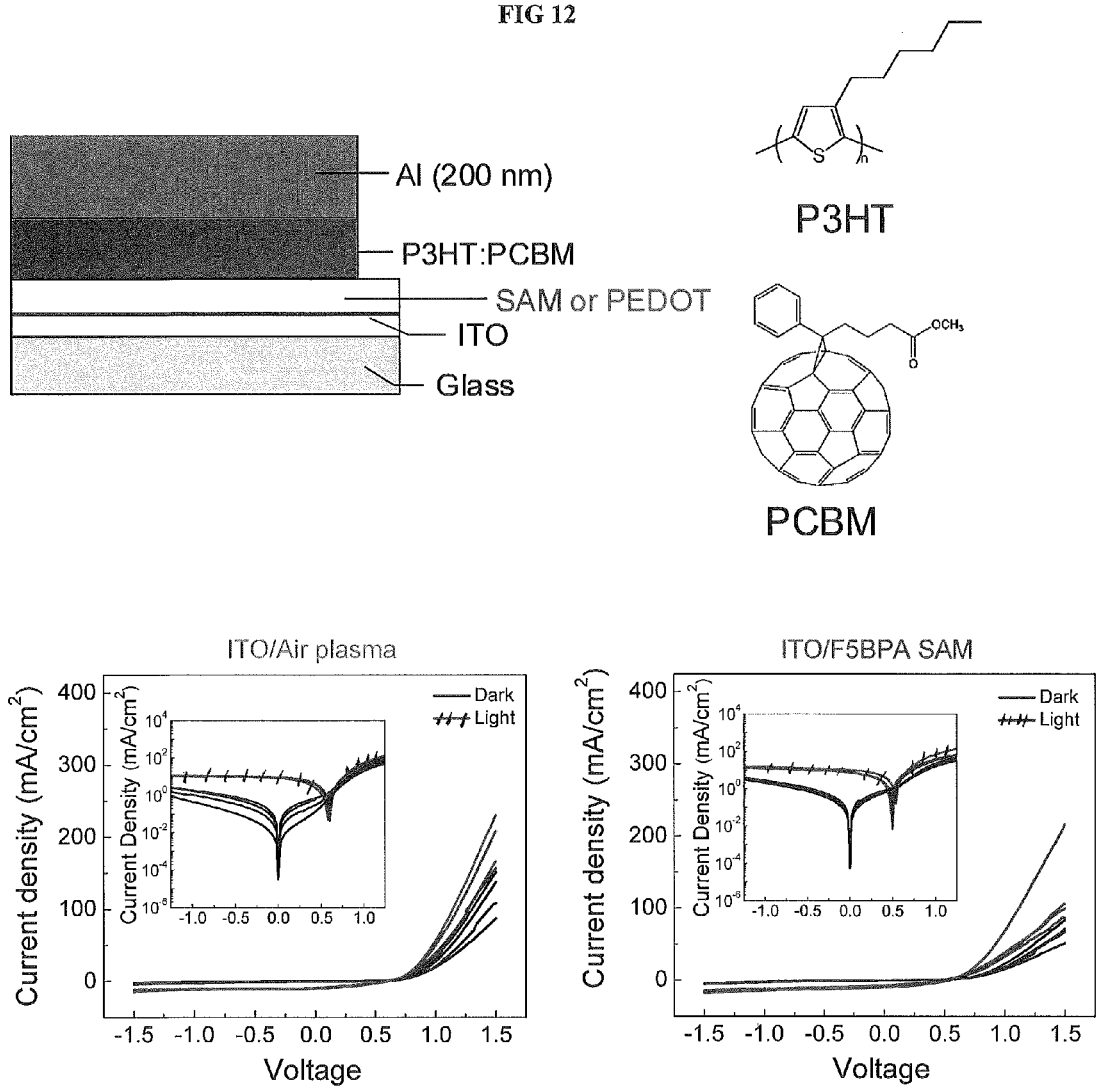
FIG. 12 shows the structure of the organic photovoltaic device (OPV) and the current-voltage (IV) graphs for OPV devices fabricated with ITO with surface-bound phosphonic acids compared to OPV devices with ITO treated with air plasma.
Figure 13:
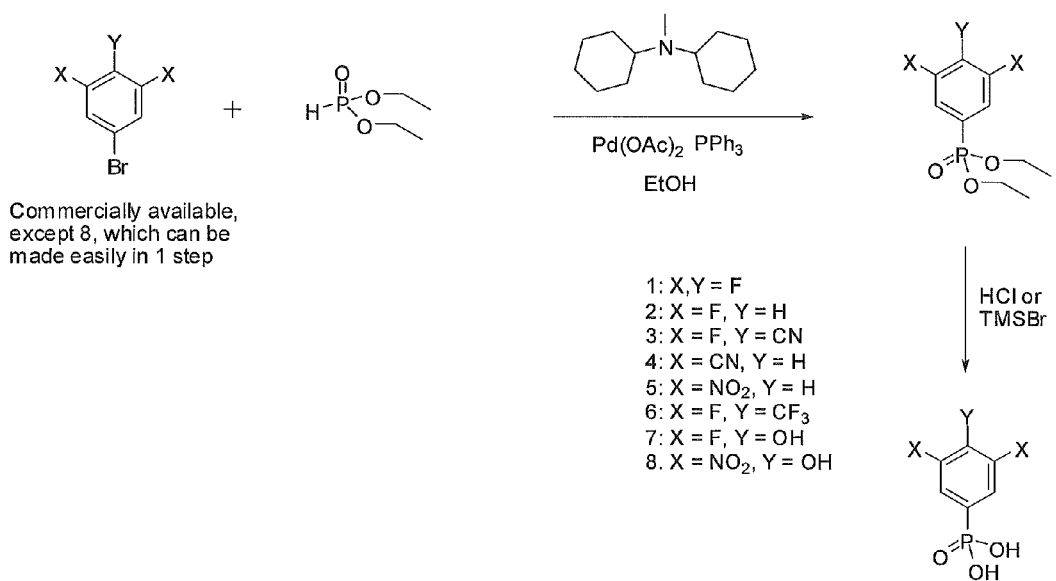
FIG. 13 shows some other phosphonic acids and methods of synthesis.

An organic photovoltaic (OPV) device (FIG. 12) was fabricated on phosphonic acid (PA) modified ITO electrode. For comparison, the OPV devices based on air plasma treatment were also fabricated. A bulk-heterojunction layer (100 nm) based on poly__3-hexylthiophene (P3HT) and __6,6_-phenyl C71 butyric acid methyl ester (PCBM-70) was spin coated from chlorobenzene solution (17 mg/ml in ratio of 10:7:: P3HT:PCBM) at 700 RPM, for 1 min. The aluminum electrodes were deposited on the top of P3HT:PCBM layer by using thermal evaporation at a pressure below $1 \times 10^{-6}$ Torr and the rate of 2 Å/s. A shadow mask was used for Al deposition to make five devices per substrate with an active area of 0.1 cm² for each device. The samples were then annealed at 150° C. on the hot plate for 30 min. under nitrogen environment. FIG. 12 shows the dark and light IV graphs for plasma treated ITO devices and phosphonic acid treated device with lamp intensity of 71.5 mW/cm². The device parameters listed in Table 4 are averages for three devices each.

TABLE 4

Performance data for OPV devices.

| | Sample | | | | | |
|---|---|---|---|---|---|---|
| | $V_{oc}$ (V) | $J_{sc}$ (mA/cm²) | FF | η (%) | $R_s A$ (Ω cm²) | $R_p A$ (Ω cm²) |
| Air plasma-ITO | 0.588 | −9.3 | 0.34 | 2.6 | 2.9 | 198 |
| F5BPA Monolayer | 0.505 | −8.2 | 0.33 | 2.0 | 6.2 | 129 |

Synthesis of Functionalized Phosphonic Acids

Synthesis of 2-(12-bromododecyl)isoindoline-1,3-dione 1,12-dibromododecane (32.22 g, 98.2 mmol), potassium phthalimide (4.60 g, 24.5 mmol), and dimethylformamide (20 mL) were combined and refluxed at 160° C. for 2.5 hours. Upon cooling, water was added and the organic taken into dichloromethane (separated on a separatory funnel). The solvent was evaporated under reduced pressure and the crude product was columned in hexanes. The spots were not separated, and the fractions were combined, the solvent removed, and the crude material re-dissolved in 300 mL acetone. This was refluxed, and 10 g potassium phthalimide was added over 4 hours. The mixture was refluxed overnight. After cooling and removing the solvent, the crude product was columned using 1:1 ethyl acetate: hexanes. The top spot proved to be the desired product, which was collected as a white solid (9.30 g) that matched the reported literature: *Helv. Chimica Acta.* 2001, 84(3), 678-689.

Synthesis of diethyl 12-(1,3-dioxoisoindolin-2-yl)dodecylphosphonate 2-(12-bromododecyl)isoindoline-1,3-dione (9.30 g, 23.6 mmol) was combined with triethylphosphite (11.76 g, 70.7 mmol) in a round bottom flask and the mixture heated and stirred at 135° C. for 16 hours. The reaction mixture was then put under hi-vacuum at 90° C. for 4 hours. The product was then obtained as a clear oil after column chromatography in ethyl acetate. (8.96 g, 84% yield). $^1$H NMR (400.14 MHz, CDCl$_3$) δ 7.80 (dd, J=5.43, 3.04 Hz, 2H), 7.67 (dd, J=5.47, 3.05 Hz, 2H), 4.08-4.02 (m, 4H), 3.63 (t, J=7.33 Hz, 2H), 1.73-1.45 (m, 6H), 1.32-1.11 (m, 22H). $^{13}$C{$^1$H} NMR (100.62 MHz, CDCl$_3$) δ 168.4 (2C), 133.7 (2C), 132.1 (2C), 123.0 (2C), 61.30 (d, J=6.5 Hz, 2C), 37.96, 30.51, (d, J=17.0 Hz), 29.41 (2C), 29.35, 29.25, 29.07, 28.98, 28.49, 26.75, 25.55 (d, J=140.1 Hz), 22.29 (d, J=5.0 Hz), 16.39 (d, J=6.1 Hz, 2C). $^{31}$P{$^1$H} NMR (161.97 MHz, CDCl$_3$): δ 33.38. MS (ESI, m/z): 452.235 (M$^+$, 100%). Exact mass calculated (found) for [M+H]$^+$, m/z: 452.256039 (452.254800). Analysis calculated (found) %: C, 63.84 (63.41), H, 8.48 (8.53).

Synthesis of 12-(1,3-dioxoisoindolin-2-yl)dodecylphosphonic acid

Diethyl 12-(1,3-dioxoisoindolin-2-yl)dodecylphosphonate (2.00 g, 4.43 mmol) was dissolved in dry dichloromethane (25 mL). Bromotrimethylsilane (1.8 mL, 14.2 mmol) was added via syringe. The reaction was capped with a greased glass stopper and allowed to stir overnight. The volatiles were removed under reduced pressure to yield a yellow oil. This was dissolved in 10:1 methanol:water (20 mL) and allowed to stir overnight. After removing the solvents, recrystallization in acetonitrile yielded a white powdery solid (1.709 g, 98% yield). $^1$H NMR (400.14 MHz, DMSO) δ 7.84 (m, 4H), 3.54 (t, J=7.1 Hz, 2H), 1.58-1.53 (m, 2H), 1.50-1.31 (m, 4H), 1.30-1.20 (m, 16H). $^{13}$C{$^1$H} NMR (100.62 MHz, DMSO) δ 167.9 (2C), 134.4 (2C), 131.6 (2C), 123.0 (2C), 37.36, 30.08 (d, J=15.8 Hz), 28.99, 28.95, 28.87 (2C), 28.70, 28.53, 27.85, 27.54 (d, J=136.5 Hz), 26.22, 22.73, (d, J=4.58 Hz). $^{31}$P{$^1$H} NMR (161.97 MHz, DMSO): δ 27.74. MS (FAB, m/z): 396.2 (M$^+$, 100%). Exact mass calculated (found) for [M+H]$^+$, m/z: 396.19399 (396.19445). Analysis calculated (found) %: C, 60.75 (60.64), H, 7.65 (7.80).

Synthesis of 11-phosphonoundecanoic acid 11-methoxy-11-oxoundecylphosphonic acid (1.72 g, 6.136 mmol) was dissolved in 8M HCl (25 mL, excess) and the mixture refluxed overnight. Upon cooling, a white crystalline solid precipitated. This was filtered and washed with cold acetonitrile. The filtrate was reduced and the precipitate that formed was also collected by filtration (1.156 g, 71% yield).

The synthesis of 3-(4-benzoylphenoxy)propylphosphonic acid was synthesized according to the literature.

Synthesis of a Phosphonic Acid Comprising a Triaryl Amine

Figure 17:
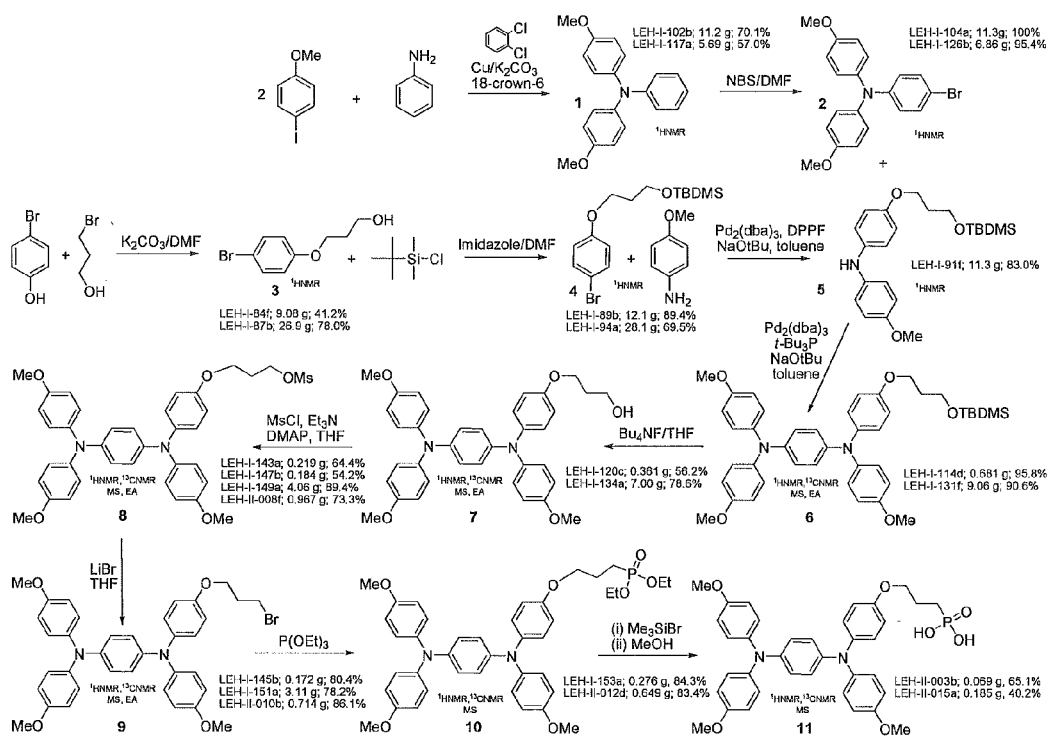
FIG. 17 outlines the synthesis of a phosphonic acid comprising a triarylamine group.

The Following Synthetic Procedures are in Reference to FIG. 17.

Synthesis of N,N-bis(4-methoxyphenyl)aniline

Freshly distilled aniline (4.84 g, 52.0 mmol), p-iodoanisole (30.4 g, 130.0 mmol), powdered anhydrous potassium carbonate (57.5 g, 416.0 mmol), electrolytic copper powder (13.3 g, 208.0 mmol), and 18-crown-6 (2.75 g, 10.4 mmol) were added to a dry, three necked round bottom flask under nitrogen. The mixture was refluxed in 100 mL o-dichlorobenzene 18 h (during which time some solvent evaporated). Ethyl acetate (250 mL) was added to the reaction flask. The resulting mixture was filtered to remove copper and organic salts and the solvent was removed under reduced pressure. The product was purified by washing with methanol to yield a tan solid (11.2 g, 70.1%). $^1$H NMR (300 MHz, CDCl$_3$) δ 7.16 (m, 2H), 7.01 (d, J=9.0 Hz, 4H), 6.78 (d, J=9.0 Hz, 4H), 6.83 (t, J=1.5 Hz, 2H), 6.81 (t, J=1.5 Hz, 1H), 3.55 (s, 6H).

Synthesis of 4-bromo-N,N-bis(4-methoxyphenyl)aniline. 2

N,N-bis(4-methoxyphenyl)aniline 1 (9.0 g, 29.5 mmol) was dissolved in 100 mL dimethylformamide in a 250 mL round bottom flask. N-bromosuccinimide (5.25 g, 29.5 mmol) was dissolved in 30 mL dimethylformamide and added dropwise to the reaction mixture. The reaction was allowed to stir at room temperature while being monitored by thin layer chromatography (TLC) (Reaction Time=23 h). The reaction mixture was quenched using 600 mL water and extracted with 4×150 mL dichloromethane. The organic layers were combined and washed with 4×150 mL saturated sodium thiosulfate solution and dried over sodium sulfate. The solvent was removed under reduced pressure. The product was purified along with materials prepared previously using flash chromatography on silica gel eluting with 5:1 hexanes:ethylacetate (12.1 g, 100%). $^1$H NMR (300 MHz, CDCl$_3$) δ 7.28 (d, J=9.0 Hz, 2H), 7.05 (d, J=9.0 Hz, 4H), 6.90 (d, J=9.0 Hz, 4H), 6.73 (d, J=9.0 Hz, 2H), 3.77 (s, 6H).

Synthesis of 3-(4-bromophenoxy)propan-1-ol

To a 250 mL round bottom flask was added 4-bromophenol (16.5 g, 95.3 mmol), 3-bromopropanol (15.9 g, 114.4 mmol), N,N-dimethylformamide (50 mL) and potassium carbonate (22.4 g, 162.0 mmol). The reaction was allowed to stir at room temperature while being monitored by TLC (CH$_2$Cl$_2$). Upon the disappearance of 4-bromophenol the mixture was poured into a separatory funnel containing 50 mL of water. The product was extracted in diethyl ether and the organic layer was washed with 3×25-mL portions of cold water. The solvent was removed under reduced pressure. The product was purified by flash chromatography on silica gel eluting with dichloromethane. The solvent was removed under reduced pressure. Residual solvent and remaining 3-bromopropanol were removed in vacuo (14.2 g, 64.4%). $^1$H NMR (300 MHz, CDCl$_3$) δ 7.35 (d, 9.0 Hz), 6.77 (d, J=9.0 Hz, 2H), 4.06 (t, J=6.0 Hz, 2H), 3.84 (t, J=6.0 Hz, 2H), 2.10 (q, J=6.0 Hz, 2H), 1.65 (s, 1H).

Synthesis of (3-(4-bromophenoxy)propoxy)(tert-butyl)dimethylsilane

To a dry 100 mL round bottom flask under nitrogen was added 3-(4-bromophenoxy)propan-1-ol (9.0 g, 39.0 mmol), tert-butyldimethylsilyl chloride (7.0 g, 47.0 mmol), imidizole (3.2 g, 47.0 mmol), and 20 mL of N,N-dimethylformamide. The reaction was allowed to stir at room temperature while being monitored by thin layer chromatography. Upon disappearance of the starting material the reaction mixture was poured into a separatory funnel containing 50 mL of cold water. The product was extracted using 3×25 mL ether. The organic layers were combined and washed with 3×25 mL cold water and 3×25 mL saturated sodium chloride solution. The resulting organic layer was dried over magnesium sulfate, filtered from drying agent, and the solvent was removed under reduced pressure. The material was purified by filtering through a plug of silica gel eluting with 4:6 dichloromethane: hexane. The solvent was removed under reduced pressure (12.1 g, 89.4%). $^1$H NMR (300 MHz, CDCl$_3$) δ 7.34 (d, J=9.0 Hz, 2H), 6.76 (d, J=9.0 Hz, 2H), 4.00 (t, J=6.0 Hz, 2H), 3.76 (t, J=6.0 Hz, 2H), 1.95 (q, J=6.0 Hz, 2H), 0.87 (s, 9H), 0.03 (s, 6H).

Synthesis of 4-(3-(tert-butyldimethylsilyloxy)propoxy)-N-(4-methoxyphenyl)aniline. 5

To a dry 500 mL round bottom flask under nitrogen was added (3-(4-bromophenoxy)propoxy)(tert-butyl)dimethylsilane (12.1 g, 35.0 mmol), 4-anisidine (5.17 g, 42.0 mmol), and 20 mL anhydrous toluene. The mixture was degassed for 10 minutes before addition of dibenzylideneacetone di palladium Pd$_2$(dba)$_3$ (0.64 g, 0.70 mmol), 1,1'-Bis(diphenylphosphino)ferrocene (DPPF) (0.68 g, 1.2 mmol), and 20 mL anhydrous toluene. After 10 minutes of mixing, sodium tert-butoxide (4.7 g, 49.0 mmol) was added with 10 mL anhydrous toluene. The reaction mixture was heated to 90° C. and allowed to stir overnight while being monitored by thin layer chromatography. Upon disappearance of the starting material the reaction mixture was filtered through a plug of silica gel eluting with dichloromethane (Reaction Time=22 h). The product was purified by flash chromatography (silica gel, 5:1 hexanes:ethyl acetate). The solvent was removed under reduced pressure. The residual solvent was removed in vacuo (11.3 g, 83.0%). $^1$H NMR (300 MHz, CDCl$_3$) δ 7.06 (d, J=3.3 Hz, 2H), 7.03 (d, J=3.3 Hz, 2H), 6.91 (d, J=3.3 Hz, 2H), 6.88 (d, J=3.3 Hz, 2H), 6.85 (s, 1H), 4.10 (t, 6.3 Hz, 2H), 3.90 (t, J=6.0 Hz, 2H), 3.81 (s, 3H), 2.01 (q, J=6.3 Hz, 2H), 0.97 (s, 9H), 0.14 (s, 6H).

Synthesis of N1-(4-(3-(tert-butyldimethylsilyloxy) propoxy)phenyl)-N1,N4,N4-tris(4-methoxyphenyl) benzene-1,4-diamine.6

Anhydrous toluene (30.0 mL) was degassed by sparging with nitrogen for 10 minutes in a dry 200 mL schlenk flask. Tri(tert-butyl) phosphine (0.187 g; 0.924 mmol) and Pd$_2$(dba)$_3$ (0.283 g, 0.309 mmol) were added and the mixture was allowed to stir. After 10 minutes, 4-bromo-N,N-bis(4-methoxyphenyl)aniline (5.92 g; 15.4 mmol), 4-(3-(tert-butyldimethylsilyloxy)propoxy)-N-(4-methoxyphenyl)aniline (6.00 g; 15.4 mmol), and sodium tert-butoxide (2.08 g, 21.6 mmol) were added. The reaction was allowed to stir at 90° C. while being monitored by TLC (5:1 hexanes:ethyl acetate). Upon the disappearance of the starting materials the mixture was filtered through Celite eluting with ethyl acetate. The product was purified by flash chromatography (silica gel, 5:1 hexanes: ethyl acetate). The solvent was removed under reduced pressure. The residual solvent was removed in vacuo (9.06 g, 90.6%). $^1$H NMR (300 MHz, C$_3$D$_6$O) δ 6.98 (m, 8H), 6.86 (m, 8H), 6.82 (s, 4H), 4.06 (t, J=6.3 Hz, 2H), 3.83 (t, J=6.3 Hz, 2H), 3.76 (s, 9H), 1.95 (q, J=6.0 Hz, 2H), 0.890 (s, 9H), 0.058 (s, 6H). $^{13}$C{$^1$H} NMR (300 MHz, C$_3$D$_6$O, δ): 156.40, 155.83, 143.65, 142.31, 126.24, 123.78, 116.04, 115.41, 65.28, 60.09, 55.63, 33.27, 26.23, −5.27. HRMS-EI (m/z): [M]$^+$ calcd for C$_{42}$H$_{50}$N$_2$O$_5$Si, 690.35. found, 690.6). Anal. Calcd for C$_{42}$H$_{50}$N$_2$O$_5$Si: C, 73.01; H, 7.29; N, 4.05. Found: C, 73.25; H, 7.43; N, 4.01.

Synthesis of 3-(4-((4-(bis(4-methoxyphenyl)amino) phenyl)(4-methoxyphenyl)amino)phenoxy)propan-1-ol. 7

To a dry 250 mL round bottom flask under nitrogen was added N1-(4-(3-(tert-butyldimethylsilyloxy)propoxy)phenyl)-N1,N4,N4-tris(4-methoxyphenyl)benzene-1,4-diamine (9.06 g, 13.1 mmol), tetrahydrofuran (12.4 mL), and tetrabutylammonium fluoride (8.21 g, 31.4 mmol). The reaction was allowed to stir at room temperature while being monitored by thin layer chromatography. Upon disappearance of the starting material the reaction mixture was poured into a separatory funnel containing 150 mL of cold water. The product was extracted using 3×75 mL ether. The organic layers were combined and dried over MgSO$_4$. The drying agent was removed by filtration and the solvent was removed under reduced pressure. The material was purified by flash chromatography (silica gel, 1:2 hexanes:ethyl acetate) and recrystallization (methanol) to yield a white solid (5.93 g, 78.6%). $^1$H NMR (400 MHz, C$_3$D$_6$O) δ 6.97 (m, 8H), 6.85 (m, 8H), 6.81 (s, 4H), 4.07 (t, J=J=6.3 Hz, 2H), 3.78 (s, 9H), 3.71 (q, J=5.7 Hz, 2H), 3.63 (t, J=5.2 Hz, 2H), 1.93 (q, J=6.3 Hz, 2H). $^1$H NMR (400 MHz, C$_3$D$_6$O with D$_2$O) δ 6.95 (m, 8H), 6.84 (m, 8H), 6.79 (s, 4H), 4.03 (t, J=6.3 Hz, 2H), 3.74 (s, 9H), 3.68 (t, J=6.2 Hz, 2H), 1.92 (q, J=6.3 Hz, 2H). $^{13}$C{$^1$H} NMR (400 MHz, C$_3$D$_6$O) δ 156.29, 155.77, 143.59, 143.53, 142.22, 142.13, 126.17, 123.68, 123.64, 115.98, 115.37, 65.74, 58.80, 55.62, 33.11. HRMS-EI (m/z): [M]$^+$ calcd for C$_{36}$H$_{36}$N$_2$O$_5$, 576.26;

found, 576.4). Anal. Calcd for $C_{36}H_{36}N_2O_5$: C, 74.98; H, 6.39; N, 4.86. Found: C, 74.80; H, 6.25; N, 4.82.

Synthesis of 3-(4-((4-(bis(4-methoxyphenyl)amino) phenyl)(4-methoxyphenyl)amino)phenoxy)propyl methanesulfonate To a dry schlenk flask was added 3-(4-((4-(bis(4-methoxyphenyl)amino)phenyl)(4-methoxyphenyl)amino)phenoxy)propan-1-ol (1.16 g, 2.01 mmol) and 4-dimethylaminopyridine (0.012 g, 0.100 mmol. The flask was evacuated under vacuum and filled with nitrogen before addition of anhydrous tetrahydrofuran (2.0 mL). The mixture was placed in an ice bath and allowed to stir for 10 minutes. Triethylamine (0.712 g, 7.04 mmol) was added and the reaction was allowed to stir for 10 minutes. Added methanesulfonyl chloride (0.691 g, 6.03 mmol) and allowed mixture to stir for 5 minutes. The ice bath was removed and the mixture was stirred at room temperature while being monitored by thin layer chromatography (1:2 hexanes:ethyl acetate). Upon disappearance of the starting material the reaction mixture was poured into a separatory funnel containing 100 mL of cold water. The product was extracted using 3×50 mL ether. The organic layers were combined and washed with 3×50 mL of water, sodium bicarbonate solution, and sodium chloride solution. The resulting ether layers were dried over $MgSO_4$. The drying agent was removed by filtration and the solvent was removed under reduced pressure. The residual solvent was removed in vacuo. The material was purified by flash chromatography (silica gel, 4:2 toluene:ethyl acetate) to yield an off-white solid (0.967 g, 73.3%). $^1$H NMR (400 MHz, $C_3D_6O$) δ 6.96 (m, 8H), 6.85 (m, 8H), 6.80 (s, 4H), 4.43 (t, J=6.3 Hz, 2H), 4.09 (t, J=6.0 Hz, 2H), 3.74 (s, 9H), 3.09 (s, 3H), 2.19 (q, J=6.2 Hz, 2H). $^{13}C\{^1H\}$ NMR (400 MHz, $C_3D_6O$) δ 156.42, 156.39, 155.30, 143.73, 143.49, 142.62, 142.26, 142.22, 126.33, 126.28, 126.00, 123.91, 123.69, 116.14, 115.41, 67.94, 64.61, 55.63, 36.97, 29.87. HRMS-EI (m/z): [M]$^-$ calcd for $C_{37}H_{38}N_2O_7S$, 654.24. found, 654.1). Anal. Calcd for $C_{37}H_{38}N_2O_7S$: C, 67.87; H, 5.85; N, 4.28. Found: C, 67.61; H, 5.77; N, 4.26.

Synthesis of N1-(4-(3-bromopropoxy)phenyl)-N1, N4,N4-tris(4-methoxyphenyl)benzene-1,4-diamine. 9

To a dry schlenk flask was added 3-(4-((4-(bis(4-methoxyphenyl)amino)phenyl)(4-methoxyphenyl)amino)phenoxy) propyl methanesulfonate (4.06 g, 6.20 mmol). The flask was evacuated under vacuum and filled with nitrogen. Lithium bromide (5.39 g; 62.0 mmol) and tetrahydrofuran (6.2 mL) were added under nitrogen. The mixture was allowed to stir at 60° C. overnight. Upon disappearance of the starting material the reaction mixture was poured into a separatory funnel containing 100 mL of cold water. The product was extracted using 3×50 mL ether. The organic layers were combined and washed with 3×50 mL of water. The resulting ether layers were dried over $Na_2SO_4$. The drying agent was removed by filtration and the solvent was removed under reduced pressure. The residual solvent was removed in vacuo (3.12 g, 78.2%). $^1$H NMR (400 MHz, $C_3D_6O$) δ 6.97 (m, 8H), 6.86 (m, 8H), 6.80 (s, 4H), 4.09 (t, J=5.9 Hz, 2H), 3.75 (s, 9H), 3.66 (t, J=6.6 Hz, 2H), 2.28 (q, J=6.2 Hz, 2H). $^{13}C\{^1H\}$ NMR (400 MHz, $C_3D_6O$) δ 156.39, 155.34, 143.71, 143.51, 142.22, 127.05, 126.27, 126.03, 123.90, 123.70, 116.10, 115.40, 114.61, 66.34, 55.62, 33.25, 31.05. HRMS-EI (m/z): [M]$^+$ calcd for $C_{36}H_{35}BrN_2O_4$, 640.18; found, 640.1). Anal. Calcd for $C_{36}H_{35}BrN_2O_4$: C, 67.60; H, 5.52; N, 4.38. Found: C, 67.43; H, 5.61; N, 4.24.

Synthesis of diethyl 3-(4-((4-(bis(4-methoxyphenyl) amino)phenyl)(4-methoxyphenyl)amino)phenoxy) propylphosphonate To a dry schlenk flask was added N1-(4-(3-bromopropoxy)phenyl)-N1,N4,N4-tris(4-methoxyphenyl)benzene-1,4-diamine (0.714 g, 1.12 mmol) and the flask was purged with nitrogen. Triethylphosphite (1.12 mL) was added and the mixture was allowed to stir at 160° C. overnight. Upon disappearance of the starting material the solvent was removed under vacuum distillation. The product was purified by flash chromatography (silica gel; ethyl acetate) to yield a light yellow oil (0.649 g, 83.4%). $^1$H NMR (400 MHz, $C_3D_6O$) δ 6.96 (m, 8H), 6.84 (m, 8H), 6.80 (s, 4H), 4.05 (m, 6H), 3.74 (s, 9H), 1.93 (m, 4H), 1.26 (t, J=7.0 Hz, 6H). $^{13}C\{^1H\}$ NMR (400 MHz, $C_3D_6O$) δ 156.36, 155.50, 143.64, 143.55, 142.41, 142.25, 126.22, 126.11, 123.80, 123.71, 116.10, 115.38, 68.35 (d, J=16.6 Hz), 61.70 (d, J=6.2 Hz), 23.52 (d, J=4.6 Hz), 22.61 (d, J=142 Hz), 16.73 (d, J=5.8 Hz). HRMS-EI (m/z): [M]$^+$ calcd for $C_{40}H_{45}N_2O_7P$, 696.30. found, 696.2). Anal. Calcd for $C_{40}H_{45}N_2O_7P$: C, 68.95; H, 6.51; N, 4.02. Found: C, 68.80; H, 6.46; N, 4.02.

3-(4-((4-(bis(4-methoxyphenyl)amino)phenyl)(4-methoxyphenyl)amino)phenoxy)propylphosphonic acid. 11

To a dry 25 mL round bottom flask under nitrogen was added diethyl 3-(4-((4-(bis(4-methoxyphenyl)amino)phenyl)(4-methoxyphenyl)amino)phenoxy)propylphosphonate (0.500 g, 0.718 mmol) and the flask was purged with nitrogen. Dichloromethane (1.00 mL) and bromotrimethylsilane (0.199 g, 2.30 mmol) were added under nitrogen and the mixture was allowed to stir at room temperature overnight. Upon disappearance of the starting material the solvent was removed through nitrogen purge. Residual solvent was removed in vacuo. Anhydrous methanol (8.00 mL) was added to the flask and allowed to stir at room temperature overnight. White solid was filtered from methanol through cannula filtration. Solid was washed using 3×5 mL anhydrous methanol and dried in vacuo. The product was collected under nitrogen atmosphere as a green solid (0.185 g, 40.2%). $^1$H NMR (400 MHz, $(CD_3)_2SO$) δ 9.87 (s, 2H), 6.89 (m, 8H), 6.83 (m, 8H), 6.71 (s, 4H), 3.91 (m, 2H), 3.69 (s, 9H), 1.84 (m, 2H), 1.51 (m, 2H). $^{13}C\{^1H\}$ NMR (400 MHz, $(CD_3)_2S$, δ): 154.98, 154.40, 142.17, 140.91, 140.77, 125.27, 125.19, 122.72, 122.68, 115.37, 114.82, 68.35 (m), 55.24, 23.62 (m). $^{31}P$ NMR (400 MHz, $(CD_3)_2S$, δ): 25.05. HRMS-EI (m/z): [M]$^+$ calcd for $C_{36}H_{37}N_2O_7P$, 640.23. found, 640.1). Anal. Calcd for $C_{36}H_{37}N_2O_7P$: C, 67.49; H, 5.82; N, 4.37. Found: C, 67.09; H, 6.16; N, 3.99.

Reaction with Functional Phosphonic Acid on ITO Surface

Synthesis of Compound for Reacting with a Functional Group: (E)-methyl 3-(4-(4,4,5,5,6,6,7,7,8,8,9, 9,10,10,11,11,11-heptadecafluoroundecyloxy)phenyl)acrylate (E)-Methyl 3-(4-hydroxyphenyl)acrylate (166 mg, 0.93 mmol) was added to dry DMSO (10 mL) and stirred under nitrogen in a round bottom flask. Crushed sodium hydroxide (44 mg, 1.1 mmol) was added. After 30 minutes, 1,1,1,2,2,3,3,4,4,5,5,6,6,7,7,8,8-heptadecafluoro-11-iodoundecane (500 mg, 0.85 mmol) was added. The reaction was allowed to stir overnight. Washed with water and extracted with dichloromethane to yield an oil. This crude product was purified on a silica column using hexanes with increasing amounts of ethyl acetate as the eluent. A white solid was isolated (418 mg, 77% yield). $^1$H NMR (400.14 MHz, CDCl$_3$) δ 7.65 (d, J=16.0 Hz), 7.48 (d, J=8.75 Hz, 2H), 6.90 (d, J=8.75 Hz, 2H), 6.32 (d, J=16.0 Hz), 4.07 (t, J=5.90 Hz, 2H), 3.80 (3H), 2.40-2.20 (m, 2H), 2.18-2.05 (m, 2H).

Modification of ITO with
(E)-11-(cinnamoyloxy)undecylphosphonic acid and
crosslinking to the surface An ITO (on glass) substrate was washed with Triton-X 100 with a lens cloth. The substrate was then sonicated in Triton-X 100 solution for 10 minutes, rinsed with water, sonicated for 10 minutes in water, washed with ethanol, and then sonicated for 10 minutes in ethanol, then washed with ethanol and dried under nitrogen. The substrate was cut into two pieces so as multiple samples could be obtained from the same substrate. All samples were subjected to air plasma (15 minutes). 1 sample was immersed horizontally in a 1 mM solution of (E)-11-(cinnamoyloxy)undecylphosphonic acid in ethanol for several hours, until the volume of the liquid was below the level of the substrate. The other sample was immersed horizontally in ethanol for several hours, until the volume of the liquid was below the level of the substrate. They were then rinsed with ethanol and put into a 140° C. oven for 36 hours. They were then sonicated for 30 minutes in a 5% v/v solution of TEA/ethanol. It was then rinsed with ethanol, then water, and dried under nitrogen.
Solution Z
A solution of (E)-methyl 3-(4-(4,4,5,5,6,6,7,7,8,8,9,9,10,10,11,11,11-heptadecafluoroundecyloxy)phenyl)acrylate (7 mg) in dichloromethane (0.5 mL).
Sample 1—
Modified ITO substrate, some of Solution Z dripped on, put in photoreactor for 10 minutes (8 bulbs—300 nm, 8 bulbs—350 nm), then rinsed with dichloromethane, sonicated in dichloromethane for 1 minute, then rinsed again in dichloromethane.
Sample 2—
Modified ITO substrate, some of Solution Z dripped on, put in photoreactor for 30 minutes (8 bulbs—300 nm, 8 bulbs—350 nm), then rinsed with dichloromethane, sonicated in dichloromethane for 1 minute, then rinsed again in dichloromethane.
Elemental analysis of the surface showed the presence of fluorine for Sample 1 and Sample 2.

Modification of ITO with 3,3,4,4,5,5,6,6,7,7,8,8-tridecafluorooctylphosphonic acid An ITO (on glass) substrate were washed with Triton-X 100 with a lens cloth. The two substrates were then sonicated in Triton-X 100 solution for 10 minutes, rinsed with water, sonicated for 10 minutes in water, washed with ethanol, and then sonicated for 10 minutes in ethanol, then washed with ethanol and dried under nitrogen (the DSC method of Table 2). The substrate was cut into smaller pieces so as multiple samples could be obtained from the same substrate.

ITO—This substrate was immersed horizontally in ethanol for several hours, until the volume of the liquid was below the level of the substrate. It was then rinsed with ethanol, then water, and dried under nitrogen.

PA/ITO 0—This substrate was immersed horizontally in a 1 mM solution of 3,3,4,4,5,5,6,6,7,7,8,8,8-tridecafluorooctylphosphonic acid in ethanol for several hours, until the volume of the liquid was below the level of the substrate. It was then rinsed with ethanol, then water, and dried under nitrogen.

PA/ITO TEA 10—This substrate was immersed horizontally in a 1 mM solution of 3,3,4,4,5,5,6,6,7,7,8,8,8-tridecafluorooctylphosphonic acid in ethanol for several hours, until the volume of the liquid was below the level of the substrate. The substrate was then sonicated for 10 minutes in a 5% v/v solution of TEA/ethanol. It was then rinsed with ethanol, then water, and dried under nitrogen.

PA/ITO TEA 30—This substrate was immersed horizontally in a 1 mM solution of 3,3,4,4,5,5,6,6,7,7,8,8,8-tridecafluorooctylphosphonic acid in ethanol for several hours, until the volume of the liquid was below the level of the substrate. The substrate was then sonicated for 30 minutes in a 5% v/v solution of TEA/ethanol. It was then rinsed with ethanol, then water, and dried under nitrogen.

PA/ITO TEA 60—This substrate was immersed horizontally in a 1 mM solution of 3,3,4,4,5,5,6,6,7,7,8,8,8-tridecafluorooctylphosphonic acid in ethanol for several hours, until the volume of the liquid was below the level of the substrate. The substrate was then sonicated for 60 minutes in a 5% v/v solution of TEA/ethanol. It was then rinsed with ethanol, then water, and dried under nitrogen.

PA/ITO THF 10—This substrate was immersed horizontally in a 1 mM solution of 3,3,4,4,5,5,6,6,7,7,8,8,8-tridecafluorooctylphosphonic acid in ethanol for several hours, until the volume of the liquid was below the level of the substrate. The substrate was then sonicated for 10 minutes in THF. It was then rinsed with ethanol, then water, and dried under nitrogen.

PA/ITO THF 30—This substrate was immersed horizontally in a 1 mM solution of 3,3,4,4,5,5,6,6,7,7,8,8,8-tridecafluorooctylphosphonic acid in ethanol for several hours, until the volume of the liquid was below the level of the substrate. The substrate was then sonicated for 30 minutes in THF. It was then rinsed with ethanol, then water, and dried under nitrogen.

PA/ITO THF 60—This substrate was immersed horizontally in a 1 mM solution of 3,3,4,4,5,5,6,6,7,7,8,8,8-tridecafluorooctylphosphonic acid in ethanol for several hours, until the volume of the liquid was below the level of the substrate. The substrate was then sonicated for 60 minutes in THF. It was then rinsed with ethanol, then water, and dried under nitrogen.

PA/ITO THF 10+10—This substrate was immersed horizontally in a 1 mM solution of 3,3,4,4,5,5,6,6,7,7,8,8,8-tridecafluorooctylphosphonic acid in ethanol for several hours, until the volume of the liquid was below the level of the substrate. The substrate was then sonicated for 10 minutes in THF. The THF was discarded and the substrate was sonicated in THF for 10 minutes more. It was then rinsed with ethanol, then water, and dried under nitrogen.

Synthesis of Poly(PEG)(Phosphonic Acid) Copolymer

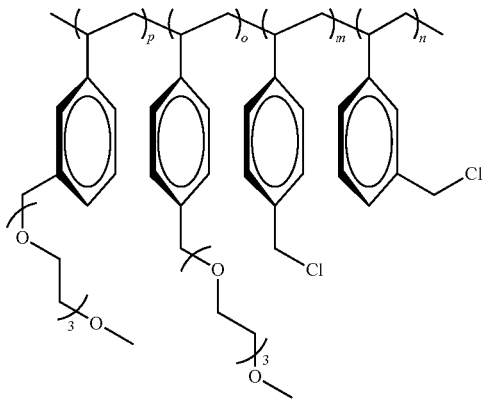

(o + p):(m + n) = 9:1

Triethylene glycolmonomethylether (1.33 mL, 8.35 mmol) was dissolved in dry THF and allowed to stir under nitrogen. Sodium hydride (224 mg, 9.34 mmol) was added and the reaction allowed to stir for 30 minutes more. Poly(vinylbenzyl chloride) (1.50 g, 9.83 mmol) was then added and the reaction was allowed to stir overnight. The solvent was removed and the residue re-dissolved in ethyl acetate and washed with water. The solvent was removed under vacuum to yield the PEG/Cl polystyrene an orange sticky oil/solid (2.34 g).

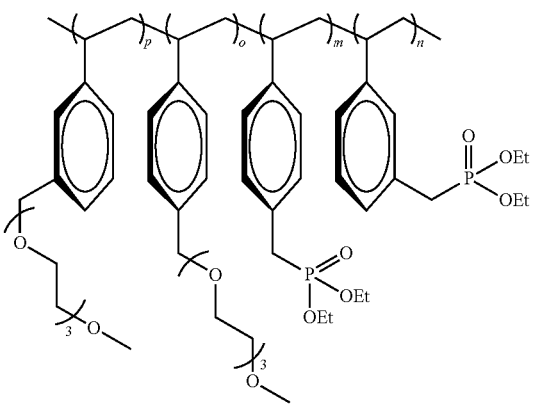

(o + p):(m + n) = 9:1

The PEG/Cl polystyrene (500 mg, 1.78 mmol) was combined with triethylphosphite (0.30 mL, 1.78 mmol) in dioxane (15 mL) and the mixture was heated at 100° C. overnight, followed by stirring at 135° C. for 8 hours. After cooling, the reaction mixture was dripped into cold hexanes (~200 mL) while stirring vigorously. The hexanes were poured off and the sticky solid at the bottom re-dissolved in a minimal amount of ethyl acetate and then re-precipitated again into cold hexanes (~200 mL). The hexanes were poured off leaving a sticky yellow solid/oil of the PEG/phosphonate polystyrene on the bottom (482 mg).

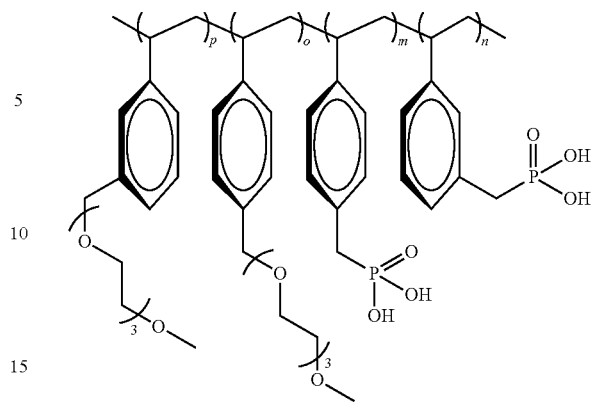

(o + p):(m + n) = 9:1

The PEG/phosphonate polystyrene was dissolved in dry dichloromethane (20 mL). Bromotrimethylsilane (1.0 mL, excess mmol) was added via syringe. The reaction was capped with a greased glass stopper and allowed to stir for 6 hours. The volatiles were removed under reduced pressure to yield a yellow oil/solid. To this was added 1:1 methanol:water (25 mL) and the reaction allowed to reflux for 8 hours. After removing the solvents, the solid was put under high-vacuum to yield the PEG/phosphonic acid polystyrene as a soft off-white solid (260 mg).

Synthesis of Potassium Phosphonates

Synthesis of Potassium hydrogenoctadecylphosphonate (octadecylphosphonic acid monobasic potassium salt)

3.0 mL of a 100 mM solution of KOH was titrated into a dispersed solution of octadecylphosphonic acid (100 mg, 0.3 mmol) in 30 mL of water while stirring. The mixture was then heated to 60° C. while stirring until the water was evaporated (about 3 hours). The resulting white solid was then dried under vacuum.

Synthesis of Potassium octadecylphosphonate (octadecylphosphonic acid dibasic potassium salt)

6.0 mL of a 100 mM solution of KOH was titrated into a dispersed solution of octadecylphosphonic acid (100 mg, 0.3 mmol) in 30 mL of water while stirring. The mixture was then heated to 60° C. while stirring until the water was evaporated (about 3 hours). The resulting white solid was then dried under vacuum.

Use of phenyl substituted PA (F3PPA and CF3PPA) as ITO modifier (a) In example 1, F3PPA was used to modify the ITO following the experimental procedure in which the ITO coated glass (20Ω/□ Colorado Concept Coatings, L.L.C.) was first cleaned in an ultrasonic bath using a dilute solution of Triton-X (Aldrich) in DI water (20 min) followed by ultrasonication in DI water (20 min). Further organic cleaning was done in the ultrasonic bath using acetone and ethanol (20 min each). Washed ITO substrate was then dried in a vacuum drying oven at 70° C. under pressure (1×10-2 Torr) for 1 h. The surface modification was performed by dipping the cleaned ITO substrates in a solution of F3PPA (1 mM in CHCl3: C2H5OH:2:1) for 30 min, followed by annealing at 120° C. (1 h). All steps were performed in a nitrogen filled glove box (O2<20 ppm and H2O<1 ppm). The work function was measured in air using a Kelvin Probe (Besocke Delta Phi). Several measurements on different locations of the F3PPA modified ITO yielded an average work function value of ~5.17 eV.

(b) In example 2, CF3PPA was used to modify the ITO following the experimental procedure as described in (a). The work function was measured in air using a Kelvin Probe (Besocke Delta Phi). Several measurements on different locations of the CF3PPA modified ITO yielded an average work function value of ~5.36 eV.

(c) In example 3, CF3PPA was used to modify the ITO following the experimental procedure as described in (a). The modified electrode was used in a single layer diode with structure ITO/modifier/α-NPD (120 nm)/Al (200 nm). α-NPD was thermally evaporated at the rate of 1 Å/s at a pressure below 1×10-7 Torr. Al cathodes were deposited at the rate of 2 Å/s using a shadow mask, and an active area of 0.1 cm2 per device was obtained. The devices were tested inside the glove box. The current voltage characteristics of the modified ITO are shown in FIG. 18 together with the ITO electrode that was not modified, and that modified with air plasma. The lower current onset and the larger current density for a given applied voltage for the diode with CF3PPA modifier in comparison to unmodified ITO is indicative of the lower barrier for injection for holes and exemplifies the increased work function of ITO when modified with CF3PPA. The charge injection improvement in the diodes based on CF3PPA is similar to air plasma treatment but with long term stability as depicted in FIG. 3.

(d) In example 4, F3PPA was used was used to modify the ITO following the experimental procedure as in (a), and a work function value of 5.17 Ev was obtained. Then the modified electrode was used in a single layer diode with structure ITO/modifier/α-NPD (120 nm)/Al (200 nm). The α-NPD, and Al were deposited using the procedure as described in (c). The current voltage characteristics of the modified of ITO are shown in FIG. 19 together with ITO electrode that was not modified. The lower current onset and the larger current density for a given applied voltage for the diode with F3PPA modifier in comparison to unmodified ITO is indicative of the lower barrier for injection for holes and exemplifies the increased work function of ITO when modified with F3PPA. For comparison, current density-voltage curve for a diode using air plasma modification is also shown.

(e) In example 5, CF3PPA was used in single layer diode with structure ITO/modifier/pentacene (100 nm)/Al (200 nm). Pentacene was thermally evaporated at the rate of 0.5 Å/s and at pressure below 1×10-7 Torr. Al cathodes were deposited at a rate of 2 Å/s using the shadow mask, leading to devices with an active area of 0.1 cm2. The current voltage characteristics of the modified ITO are shown in FIG. 20 together with that on a ITO electrode that was not modified. The diode with the ITO modified using the modifier CF3PPA exhibited a similar injection and current density-voltage (J-V) characteristics as the diode without the surface modifier. This invariance of the injection barrier upon increasing the work function of ITO in sigle layer diodes has been assigned to the Fermi level pinning effect (J. Appl. Phys. 105, 074511, 2009).

(f) In example 6, F3PPA was used in single layer diode with structure ITO/modifier/pentacene (100 nm)/Al (200 nm). The device was fabricated using the method described in (e). The current voltage characteristics of the modified of ITO are shown in FIG. 21 together with that on a ITO electrode that was not modified. The diode with the ITO modified using the modifier F3PPA exhibited a similar current density-voltage (J-V) characteristics as the diode without the surface modifier.

(g) In example 6, CF3PPA was used to modify the ITO following the experimental procedure as described in (a) and a work function value of ~5.36 eV was obtained. The surface modification was performed on two different grades of ITO obtained from different sources. FIG. 22 shows the measured work function of modified ITO as a function of time and illustrates the stability of the modified ITO. The variation in the work function for the ITO modified using CF3PPA was less than 1.8% of the initial value over the measured period of time. This exemplifies that the stability of the work function based on surface modifier is >4,000 h in air. In contrast, the improved work function of the ITO achieved by other means such as air plasma is not stable and was shown in FIG. 3. Surface modification using triphenylamine PA that can be doped:

(h) In example 7, the triphenylamine PA was used as a surface modifier in which the ITO coated glass (20Ω/□ Colorado Concept Coatings, L.L.C.) was prepared as described in (a). The surface modification was performed by dipping the cleaned ITO substrates in a solution of triphenylamine PA (1 mM in dry THF) for 30 min, followed by annealing at 120° C. (1 h). The modified ITO substrate with triphenylamine PA SAM layer was then doped using a strong electron acceptor. An example of doping the PA using F4TCNQ is shown in the scheme below. All steps were performed in a nitrogen filled glove box (O2<20 ppm and H2O<1 ppm)

(i) In example 8, the triphenylamine PA in doped and undoped form was used in single layer diodes with structure ITO/modifier/□-NPD (120 nm)/Al (200 nm). α-NPD and Al were thermally evaporated as described in (c). The devices were tested inside the glove box filled with nitrogen. The current voltage characteristics of the modified ITO using undoped and doped triphenylamine PA are compared in FIG. 23.

Testing of Surface Modifiers in Organic Solar Cells (j) In example 9, the ITO modified using CF3PPA following the experimental procedure as described in (a) was used in organic solar cells with configuration ITO/modifier/pentacene (50 nm)/C60 (45 nm)/BCP (8 nm)/Al (200 nm). First, a barrier layer of SiOx (300 nm) was deposited on half of the substrate to avoid electrical shorts during device testing. Then, a 50 nm thick pentacene layer was deposited at a rate of 0.5 Å/s on modified ITO. A layer of C60 (45 nm) was then deposited on top of the pentacene layer at a rate of 1 Å/s. A thin layer of BCP, to act as an exciton blocking layer, was subsequently deposited at a rate of 0.4 Å/s. All organic materials were thermally evaporated at a pressure below 1×10-7 Ton. Al cathodes (200 nm) were deposited using a shadow mask to produce five defined devices per substrate with an active area of 0.1 cm2 each. The devices were tested inside a nitrogen filled glove box (O2<1 ppm and H2O<1 ppm). Solar cell characteristics were measured using a 175 W Xenon lamp (ASB-XE-175EX, CVI) broadband light source (350-900 nm) with an irradiance of 78 mW/cm2.

The current density-voltage (J-V) characteristics of the OPV devices measured in the dark and under illumination, using CF3PPA modifier are shown in FIG. 24. The photovoltaic parameters, Voc, Jsc, FF, and power conversion efficiency (η) under broad band illumination (irradiance ~78 mW/cm2), averaged over 3 devices, are summarized in Table X. For comparison, the performance of the OPV devices using unmodified and air plasma modified ITO fabricated in same run are also tabulated. The OPV devices based on CF3PPA modified ITO, with higher work function, yield similar performance (within the error bar, see Table X) of the devices as that for unmodified and air plasma modified ITO.

TABLE X

| Surface modifier | $V_{OC}$ (mV) | $J_{SC}$ (mA/cm$^2$) | FF | η (%) |
|---|---|---|---|---|
| CF3PPA (Φ = 5.36 eV) | 364 ± 0 | 10 ± 0.2 | 0.53 ± 00 | 2.8 ± 0.0 |
| Unmodified | 370 ± 4 | 10 ± 0.4 | 0.52 ± 0.01 | 2.8 ± 0.06 |
| Air plasma | 374 ± 2 | 10 ± 0.3 | 0.54 ± 00 | 2.9 ± 0.09 |

Other embodiments are within the following claims.

The invention claimed is:

1. A device comprising a) an electrode, the electrode having a surface; b) a molecule bound to the surface of the electrode; and c) an organic electronic material in electrical contact with the electrode, wherein the molecule comprises at least one fluorinated aryl group, wherein the electrode comprises a transparent conductive metal oxide, a carbon nanotube, or graphene; wherein the molecule is:

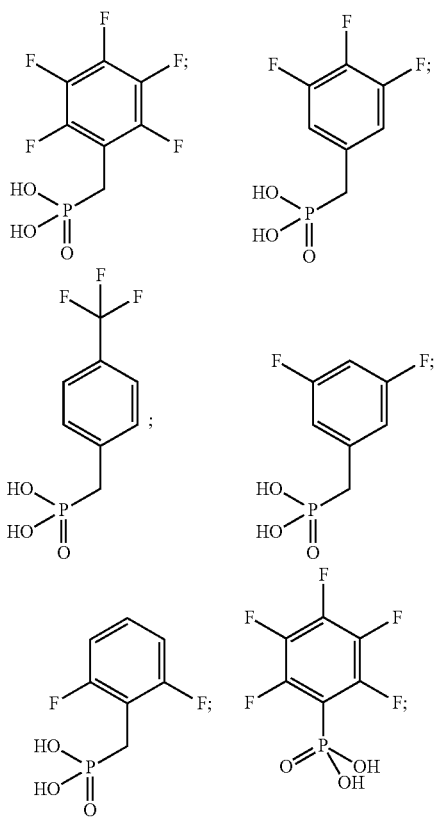

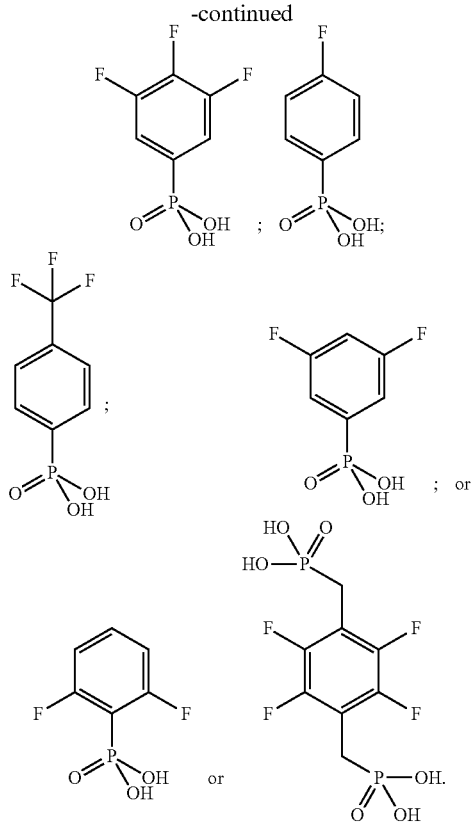

2. The device of claim 1, wherein the electrode comprises a transparent conductive metal oxide.

3. The device of claim 2, wherein the transparent conductive metal oxide comprises indium tin oxide, indium zinc oxide, zinc oxide, gallium aluminum zinc oxide, antimony tin oxide, fluorine tin oxide, cadmium oxide, or cadmium stannate.

4. The device of claim 1, wherein the molecule constitutes a monolayer on the surface of the electrode.

5. The device of claim 1, wherein the electrode comprises indium tin oxide (ITO).

6. A composition of matter, comprising

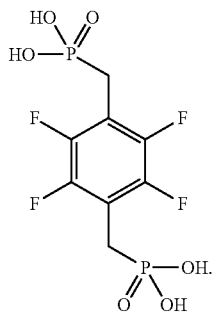 [SMILES: O=P(O)(O)Cc1c(F)c(F)c(CP(=O)(O)O)c(F)c1F]

* * * * *